(12) United States Patent
Lin

(10) Patent No.: US 11,877,455 B2
(45) Date of Patent: Jan. 16, 2024

(54) METHOD FOR PREPARING VERTICAL MEMORY STRUCTURE WITH AIR GAPS

(71) Applicant: NANYA TECHNOLOGY CORPORATION, New Taipei (TW)

(72) Inventor: Yuan-Yuan Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 202 days.

(21) Appl. No.: 17/538,106

(22) Filed: Nov. 30, 2021

(65) Prior Publication Data

US 2022/0093640 A1 Mar. 24, 2022

Related U.S. Application Data

(62) Division of application No. 16/848,359, filed on Apr. 14, 2020, now Pat. No. 11,411,019.

(51) Int. Cl.
*H10B 43/27* (2023.01)
*H01L 23/532* (2006.01)
(Continued)

(52) U.S. Cl.
CPC ......... *H10B 43/27* (2023.02); *H01L 21/7682* (2013.01); *H01L 23/5329* (2013.01);
(Continued)

(58) Field of Classification Search
CPC ........... H01L 27/11582; H01L 27/1157; H01L 29/66545; H01L 27/11556;
(Continued)

(56) References Cited

U.S. PATENT DOCUMENTS

| 2020/0083352 A1 | 3/2020 | Chanemougame et al. |
| 2020/0312870 A1 | 10/2020 | Xiao |
| 2021/0193674 A1* | 6/2021 | Said ................. H01L 21/02244 |

FOREIGN PATENT DOCUMENTS

| TW | I608619 B | 12/2017 |
| TW | I608619 B | 12/2017 |

(Continued)

OTHER PUBLICATIONS

Office Action dated Jan. 17, 2022 related to Taiwanese Application No. 110108709.
(Continued)

*Primary Examiner* — Tony Tran
(74) *Attorney, Agent, or Firm* — Xuan Zhang

(57) ABSTRACT

The present disclosure provides a method for preparing a vertical memory structure with air gaps. The method includes providing a substrate; forming an impurity layer at an upper portion of the substrate; forming a semiconductor stack including a lower semiconductor pattern structure filling a recess on the substrate and protruding from an upper surface of the substrate in a first direction substantially perpendicular to the upper surface of the substrate; forming a plurality of gate electrodes surrounding a sidewall of the semiconductor stack, the plurality of gate electrodes being at a plurality of levels, respectively, so as to be spaced apart from each other in the first direction; and forming a plurality of air gap structures disposed at outer sides of the plurality of gate electrodes respectively.

7 Claims, 19 Drawing Sheets

(51) Int. Cl.
  *H01L 21/768*      (2006.01)
  *H01L 21/02*       (2006.01)
  *H01L 21/311*      (2006.01)
  *H01L 23/522*      (2006.01)
(52) U.S. Cl.
  CPC .. *H01L 21/02579* (2013.01); *H01L 21/02636* (2013.01); *H01L 21/31127* (2013.01); *H01L 23/5226* (2013.01)
(58) Field of Classification Search
  CPC ... H01L 29/42392; H10B 43/27; H10B 41/27; H10B 43/35; H10B 41/35; H10B 41/10
  See application file for complete search history.

(56) References Cited

FOREIGN PATENT DOCUMENTS

| | | |
|---|---|---|
| TW | 201929193 A | 7/2019 |
| TW | 201929193 A | 7/2019 |
| TW | I668799 B | 8/2019 |
| TW | 202006933 A | 2/2020 |
| TW | 202010106 A | 3/2020 |

OTHER PUBLICATIONS

Office Action dated Feb. 8, 2023 related to Taiwanese Application No. 110142381.

\* cited by examiner

METHOD FOR PREPARING VERTICAL MEMORY STRUCTURE WITH AIR GAPS

CROSS-REFERENCE TO RELATED APPLICATION

This application is a divisional application of U.S. Non-Provisional application Ser. No. 16/848,359 filed on Apr. 14, 2020, which is incorporated herein by reference in its entirety.

TECHNICAL FIELD

The present disclosure relates to a method for preparing a vertical memory structure, and more particularly, to a method for preparing a vertical memory structure with air gaps for reducing capacitive coupling.

DISCUSSION OF THE BACKGROUND

Semiconductor dies are widely used in electronics industries. Semiconductor dies may have relatively small sizes, multi-functional characteristics, and/or relatively low manufacture costs.

Semiconductor dies may be categorized as any one of semiconductor memory dies storing logical data, semiconductor logic dies processing logical data, and hybrid semiconductor dies having both the function of the semiconductor memory dies and the function of the semiconductor logic dies.

Relatively high-speed and relatively low-voltage semiconductor dies may satisfy desired characteristics (e.g., high speed and/or low power consumption) of electronic dies including semiconductor dies. Semiconductor dies may be relatively highly integrated. Reliability of semiconductor dies may be reduced by relatively high integration density of the semiconductor dies.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a vertical memory structure, comprising: a semiconductor stack including a lower semiconductor pattern structure filling a recess on a substrate and protruding from an upper surface of the substrate in a first direction substantially perpendicular to the upper surface of the substrate; a plurality of gate electrodes surrounding a sidewall of the semiconductor stack, the plurality of gate electrodes being at a plurality of levels, respectively, so as to be spaced apart from each other in the first direction; and a plurality of air gap structures disposed at outer sides of the plurality of gate electrodes respectively.

In some embodiments, the plurality of air gap structures comprise a liner layer enclosing an air gap.

In some embodiments, the vertical memory structure further comprises a conductive line, and the plurality of air gap structures separate the conductive line from the plurality of gate electrodes.

In some embodiments, the lower semiconductor pattern structure comprises a first undoped semiconductor pattern, a doped semiconductor pattern, and a second undoped semiconductor pattern sequentially stacked in the first direction.

In some embodiments, the vertical memory structure further comprises an upper semiconductor pattern extends in the first direction on the lower semiconductor pattern structure, wherein a lower surface of the doped semiconductor pattern is lower than the upper surface of the substrate.

In some embodiments, an upper surface of the doped semiconductor pattern of the lower semiconductor pattern is higher than a lower surface of a lowermost one of the plurality of gate electrodes and lower than an upper surface thereof.

In some embodiments, the vertical memory structure further comprises a first diffusion prevention pattern between the first undoped semiconductor pattern and the doped semiconductor pattern; and a second diffusion prevention pattern between the doped semiconductor pattern and the second undoped semiconductor pattern.

In some embodiments, each of the first and second diffusion prevention patterns is a semiconductor pattern doped with carbon.

In some embodiments, the second diffusion prevention pattern is a semiconductor pattern doped with carbon and boron.

In some embodiments, the vertical memory structure further comprises an impurity layer at an upper portion of the substrate.

In some embodiments, the doped semiconductor pattern contacts the impurity layer.

In some embodiments, a lower surface of the doped semiconductor pattern is higher than a lower surface of the impurity layer.

In some embodiments, a lower surface of the doped semiconductor pattern is lower than a lower surface of the impurity layer.

In some embodiments, the impurity layer includes p-type impurities.

Another aspect of the present disclosure provides a method for preparing a vertical memory structure, comprising: forming a semiconductor stack including a lower semiconductor pattern structure filling a recess on a substrate and protruding from an upper surface of the substrate in a first direction substantially perpendicular to the upper surface of the substrate; forming a plurality of gate electrodes surrounding a sidewall of the semiconductor stack, the plurality of gate electrodes being at a plurality of levels, respectively, so as to be spaced apart from each other in the first direction; and forming a plurality of air gap structures at outer sides of the plurality of gate electrodes respectively.

In some embodiments, forming a plurality of air gap structures comprises: forming a plurality of energy removable blocks at outer sides of the plurality of gate electrodes respectively; sealing the a plurality of energy removable blocks; and performing a heat treatment process to form a plurality of air gap structures from the a plurality of energy removable blocks.

In some embodiments, forming a plurality of energy removable blocks comprises: forming an energy removable layer covering the outer sides of the plurality of gate electrodes; and performing an anisotropic etching process to remove a portion of the energy removable layer, while leaving the plurality of energy removable blocks adjacent to the plurality of gate electrodes.

In some embodiments, the energy removable layer comprises a base material and a decomposable porogen material, and the decomposable porogen material comprises a porogen organic compound.

In some embodiments, the heat treatment process transforms the plurality of energy removable blocks into the plurality of air gap structures including a liner layer enclosing an air gap.

In some embodiments, the method for preparing a vertical memory structure further comprises: forming a conductive line, with the plurality of air gap structures separate the conductive line from the plurality of gate electrodes.

The vertical memory structure includes a plurality of conductive features (e.g., the gate electrodes and the conductive line) disposed over the substrate, and these conductive features are electrically separated from each other by the air gap structures. Therefore, the parasitic capacitance between the conductive features may be reduced, and the overall device performance may be improved (i.e., the decreased power consumption and resistive-capacitive (RC) delay), and the yield rate of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
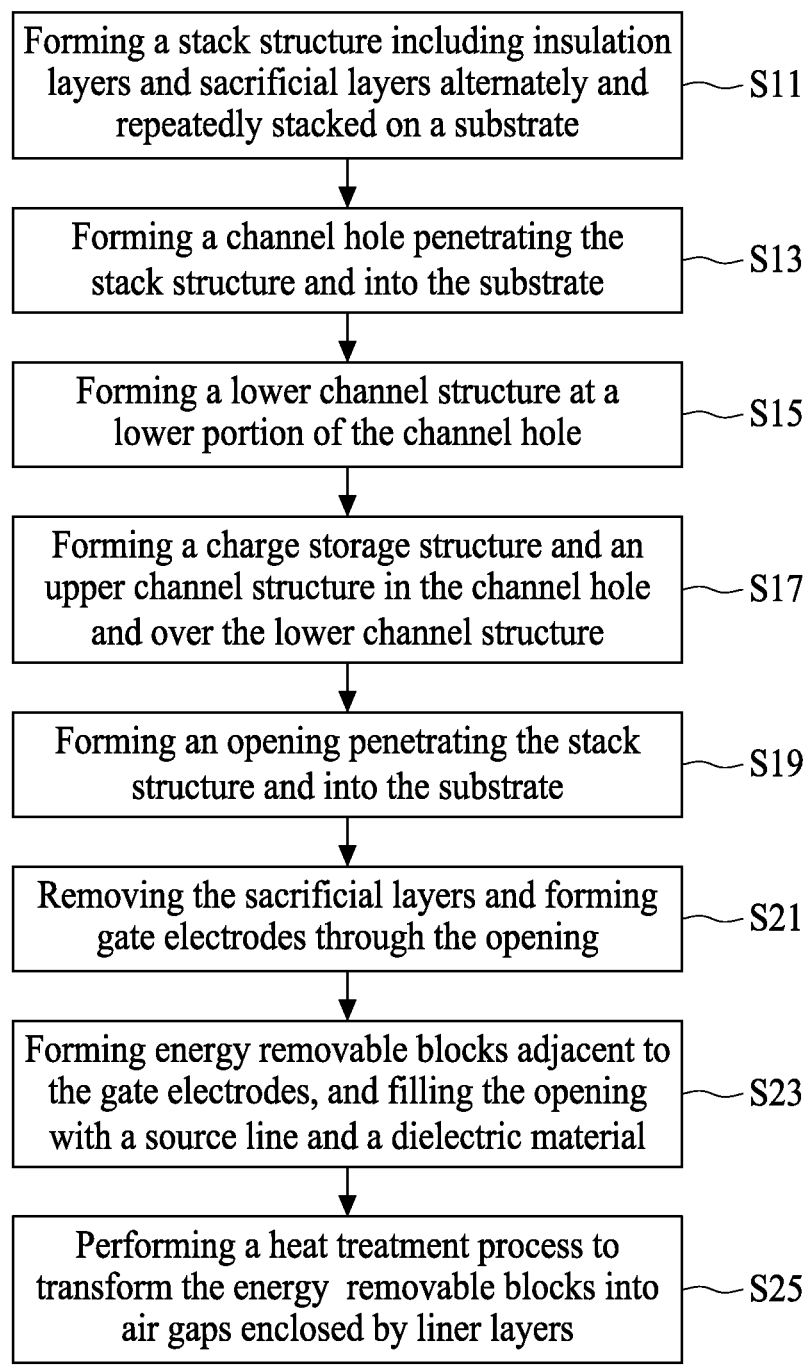
FIG. 1 illustrates a method for fabricating a vertical memory structure with air gaps for reducing capacitive coupling between conductive features according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the die in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor memory die generally means a die which can function by utilizing semiconductor characteristics, and an electro-optic die, a light-emitting display die, a semiconductor circuit, and an electronic die are all included in the category of the semiconductor die.

It should be noted that, in the description of the present disclosure, above (or up) corresponds to the direction of the arrow of the direction Z, and below (or down) corresponds to the opposite direction of the arrow of the direction Z.

FIG. 1 illustrates a method 10 for fabricating a vertical memory structure with air gaps for reducing capacitive coupling between conductive features according to some embodiments of the present disclosure. The method 10 may be performed as operations. It may be noted that the method 10 may be performed in any order and may include the same, more, or fewer operations. It may be noted that the method 10 may be performed by one or more pieces of semiconductor fabrication equipment or fabrication tools.

In some embodiments, the method 10 includes operations (steps) S11, S13, S15, S17, S19, S21, S23, and S25. The steps S11 to S25 of FIG. 1 are elaborated in connection with following figures.

Figure 2:
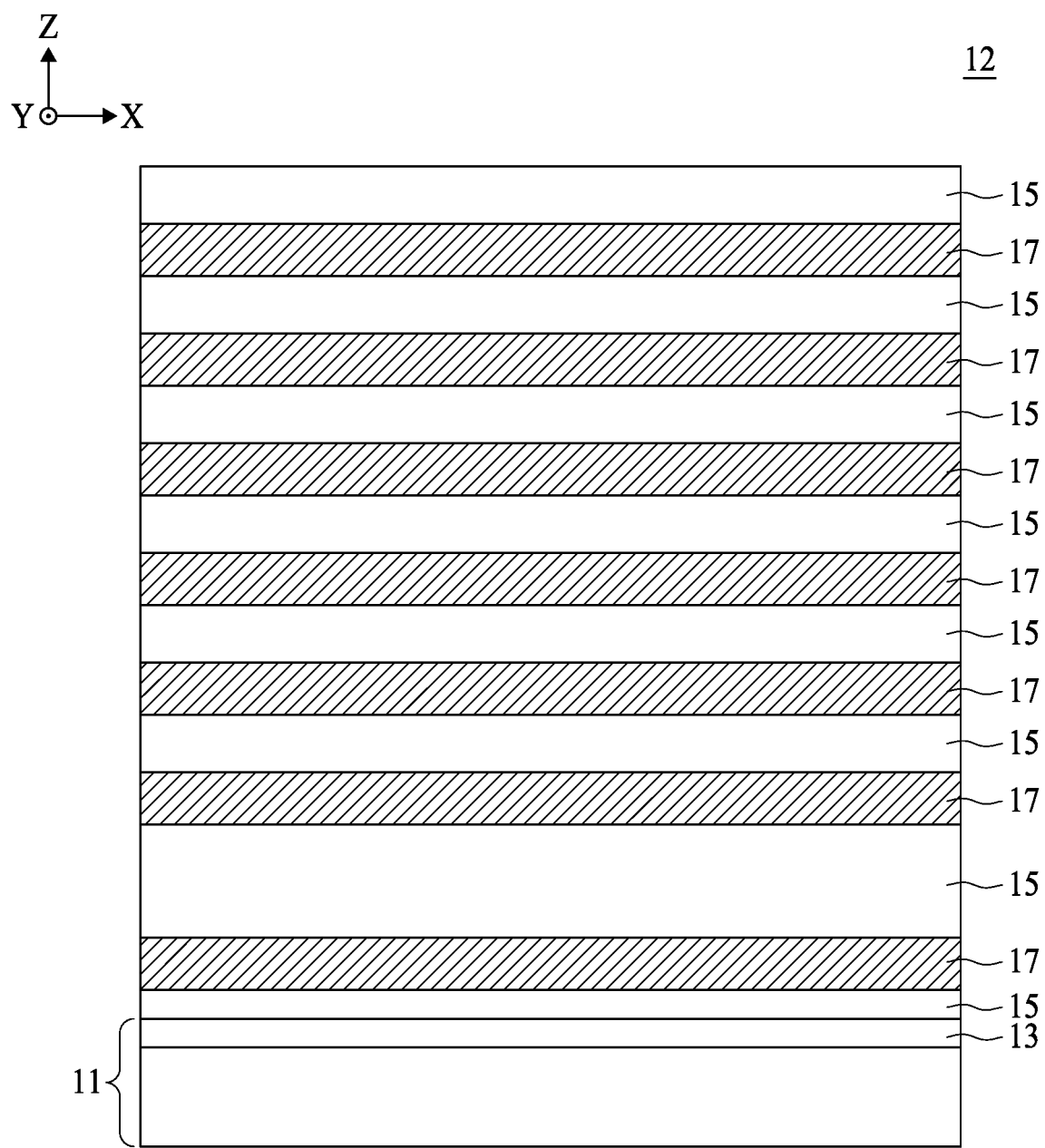
FIG. 2 is a cross-sectional view illustrating an intermediate stage in the formation of a stack structure on a substrate of the vertical memory structure, in accordance with some embodiments of the present disclosure.

FIG. 2 is a cross-sectional view illustrating an intermediate stage in the formation of the vertical memory structure 100, in accordance with some embodiments of the present disclosure. In some embodiments, the method 10 begins at operation S11 that forms a stack structure 12 including insulation layers 15 and sacrificial layers 17 alternately and repeatedly stacked on a substrate 11. In some embodiments, impurities may be implanted into an upper portion of the substrate 11 to form the first impurity region 13, and insulation layers 15 and sacrificial layers 17 may be alternately and repeatedly formed on the substrate 11 having the first impurity region 13. Thus, a plurality of insulation layers 15 and a plurality of sacrificial layers 17 may be alternately stacked on each other in the first direction (Z direction) on the substrate 11.

In some embodiments, the substrate 11 may be a semiconductor wafer such as a silicon wafer. Alternatively or additionally, the semiconductor substrate 11 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 11 includes an epitaxial layer. For example, the semiconductor substrate 11 has an epitaxial layer overlying a bulk semiconductor. In some embodiments, the semiconductor substrate 11 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

In some embodiments, the semiconductor substrate 11 may be a variety of materials, including, but not limited to, sapphire, silicon, gallium nitride (GaN), germanium, or silicon carbide. The semiconductor substrate 11 may be silicon on insulator (SOI). In some embodiments of the present disclosure, the semiconductor substrate 11 is silicon. crystallographic orientation of a substantially monocrystalline semiconductor substrate 11 may be any of (100), (111), or (110) on the Miller Indices. Other crystallographic orientations are also possible. The crystallographic orientations of semiconductor substrate 11 may be offcut. In some embodiments of the present disclosure, the semiconductor substrate 11 is (100) silicon with crystalline substrate surface region having cubic crystallinity. In another embodiment, for a (100) silicon semiconductor substrate 11, the semiconductor surface may be miscut, or offcut, for example 2-10. degree. toward (110). In another embodiment, semiconductor substrate 11 is (111) silicon with crystalline substrate surface region having hexagonal crystallinity.

In some embodiments, the first impurity region 13 may be formed by an ion implantation process. In example embodiments, the ion implantation process may be performed using p-type impurities, e.g., boron, aluminum, etc., and thus, the first impurity region 13 may include p-type impurities.

In some embodiments, the insulation layers 15 and the sacrificial layers 17 may be formed by a chemical vapor deposition (CVD) process, a plasma enhanced chemical vapor deposition (PE-CVD) process, an atomic layer deposition (ALD) process, etc. For example, a lowermost one of the insulation layers 15 may be formed by a thermal oxidation process of an upper surface of the substrate 11

In some embodiments, the insulation layer 15 may be formed of a silicon oxide, e.g., plasma enhanced tetraethylorthosilicate (PE-TEOS), high density plasma (HDP) oxide, plasma enhanced oxide (PEOX), etc. The sacrificial layers 17 may be formed of a material having an etching selectivity with respect to the insulation layers 15, e.g., silicon nitride.

Figure 3:
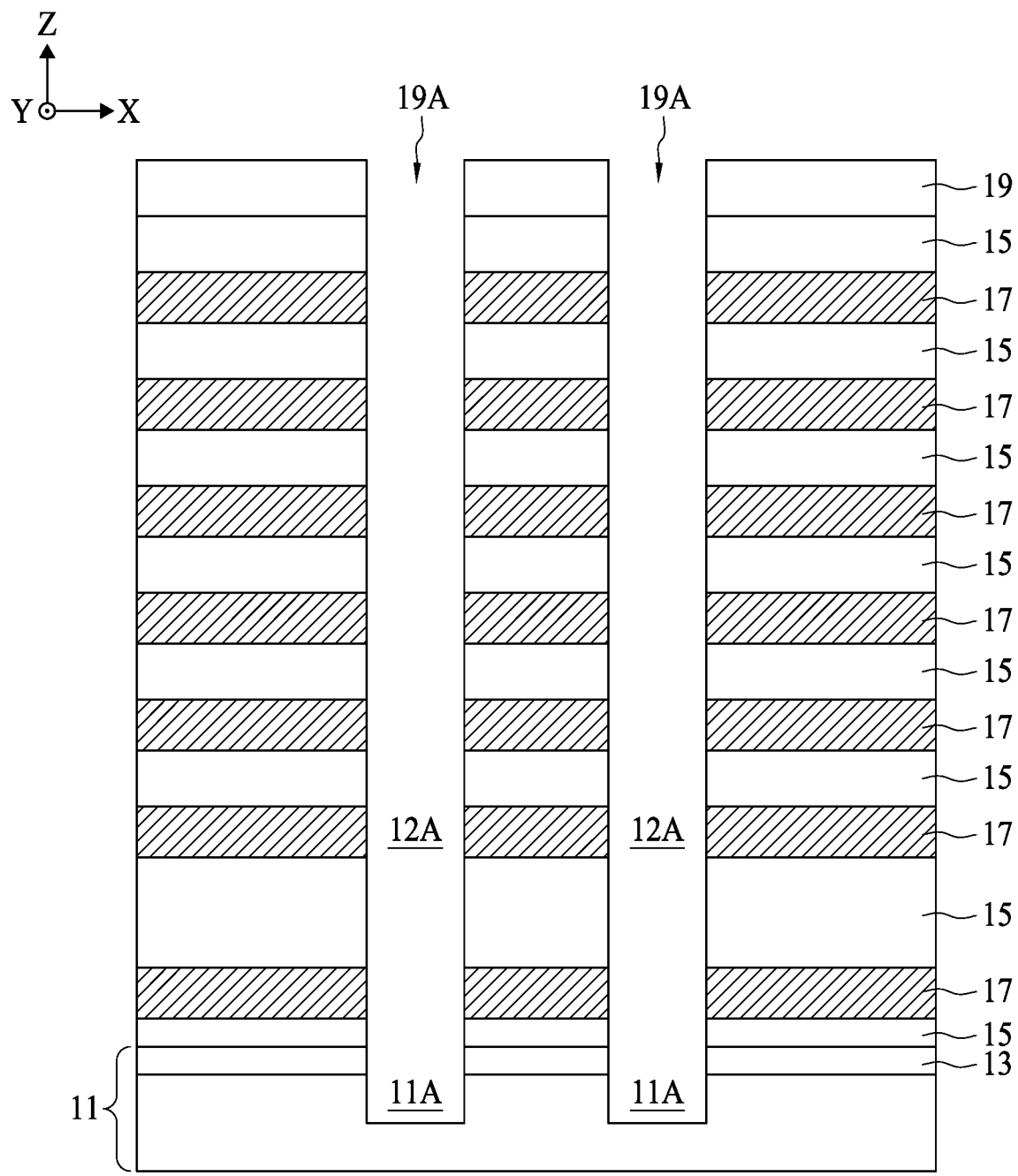
FIG. 3 is a cross-sectional view illustrating an intermediate stage in the formation of a channel hole penetrating the stack structure and into the substrate, in accordance with some embodiments of the present disclosure.

Referring to FIG. 3, at the step S13 in the method 10 shown in FIG. 2, fabrication processes are performed to form a channel hole penetrating the stack structure and into the substrate. In some embodiments, a hard mask 19 having openings 19A may be formed on an upper surface of the staircase structure and an upper surface of the first insulating interlayer pattern. The hard mask 19 may be formed of an oxide, e.g., silicon oxide, and thus may be merged with the first insulating interlayer pattern and/or the uppermost one of the insulation layers 15. The insulation layers 15 and the sacrificial layers 17 may be etched using the hard mask 19 as an etching mask to form a channel hole 12A therethrough exposing an upper surface of the substrate 11.

In example embodiments, a plurality of channel holes 12A may be formed, e.g., to be spaced apart from each other, in the second direction (X direction) and the third direction (Y direction) to form a channel array. In example embodiments, the channel hole array may include a first channel hole column including a plurality of first channel holes arranged in the second direction, and a second channel hole column being spaced apart from the first channel hole column in the third direction and including a plurality of second holes arranged in the second direction. The first and second channel hole columns may be alternately and repeatedly formed in the third direction to form a channel hole block.

In example embodiments, when the channel hole 12A is formed, an upper portion of the substrate 11 may be partially removed to form a recess 11A in the substrate 11. The channel hole 12A may include the recess in the substrate 11, e.g., the recess may define the bottom of the channel hole 12A. The recess 11A may have a depth greater than a lower surface of the first impurity region 13, e.g., the recess 11A may extend through the first impurity region 13 to have a bottom lower than the lower surface of the first impurity region 13 relative to the bottom of the substrate 11.

Figure 4:
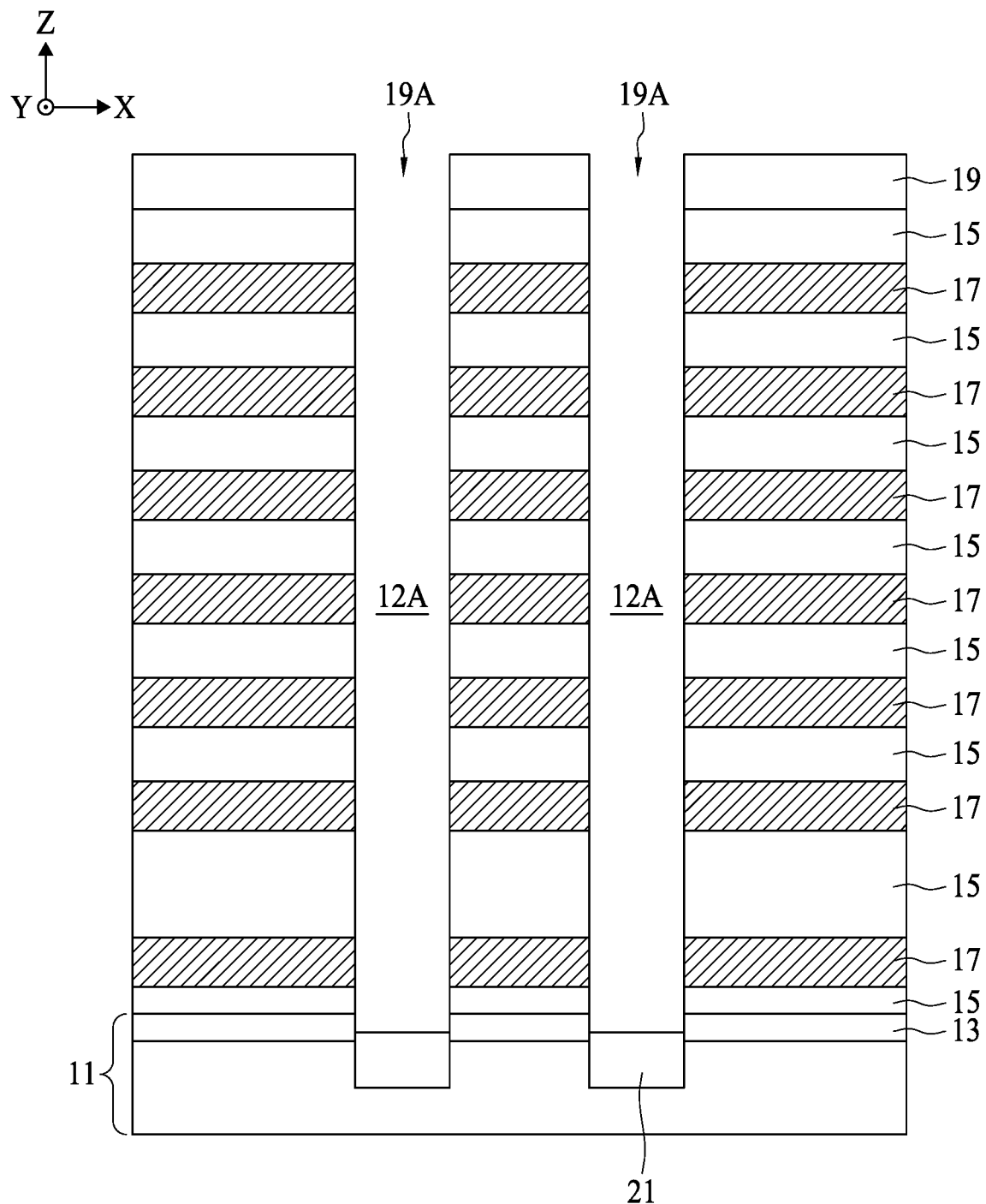
FIGS. 4-8 are cross-sectional views illustrating an intermediate stage in the formation of a lower channel structure at a lower portion of the channel hole, in accordance with some embodiments of the present disclosure.

Referring to FIG. 4, at the step S15 in the method 10 shown in FIG. 2, a lower channel structure is formed at a lower portion of the channel hole. In some embodiments, a first undoped semiconductor pattern 21 may be formed to fill a lower portion of the channel hole 12A. For example, a first selective epitaxial growth (SEG) may be performed using a portion of the substrate 11 exposed by the recess 11A as a seed to form the first undoped semiconductor pattern 21 to partially fill the channel hole 12A. Thus, the first undoped semiconductor pattern 21 may include single crystalline silicon, single crystalline germanium, etc., depending on the material of the substrate 11.

In example embodiments, the first SEG process may be performed using a semiconductor source gas, an etching gas, and a carrier gas. In an example embodiment, the semiconductor source gas may include a silicon source gas, e.g., dichlorosilane (SiH.sub.2Cl.sub.2) gas, the etching gas may include, e.g., hydrogen chloride (HCl) gas, and the carrier gas may include, e.g., hydrogen (H.sub.2) gas. Thus, the first undoped semiconductor pattern 21 may include single crystalline silicon not doped with impurities.

In another example, the first undoped semiconductor pattern 21 may be formed by forming an amorphous semiconductor layer filling the channel hole 12A, and performing a laser epitaxial growth (LEG) process or a solid phase epitaxy (SPE) process.

In example embodiments, an upper surface of the first undoped semiconductor pattern 21 may be lower than an upper surface of the substrate 11 on which no recess is formed, e.g., the upper surface of the first undoped semiconductor pattern 21 may be lower than an upper surface of the first impurity region 13 in FIG. 4. In an example embodiment, the upper surface of the first undoped semiconductor pattern 21 may be higher than the lower surface of the first impurity region 13, e.g., relative to the bottom of the substrate 11. However, embodiments are not limited thereto.

Figure 5:
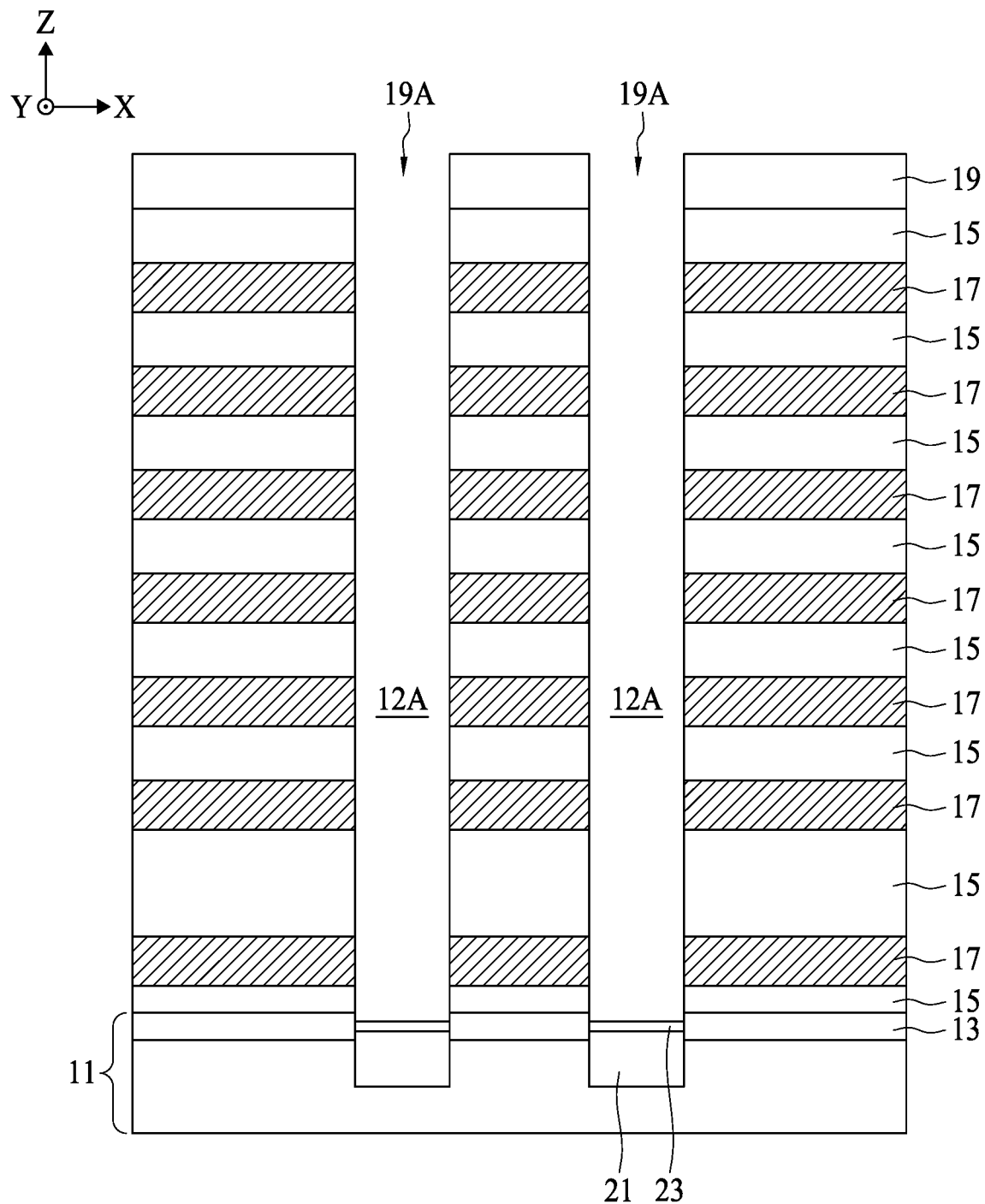

Referring to FIG. 5, a first gas phase deposition (GPD) process may be performed on the first undoped semiconductor pattern 21 to form a first diffusion prevention pattern 23 on the first undoped semiconductor pattern 21. In example embodiments, the first GPD process may be performed using a carbon source gas, and thus a semiconductor pattern doped with carbon may be formed as the first diffusion prevention pattern 23. When the first undoped semiconductor pattern 21 includes single crystalline silicon, the first diffusion prevention pattern 23 may include single crystalline silicon doped with carbon.

FIG. 5 shows that a lower surface of the first diffusion prevention pattern 23 is higher than the lower surface of the first impurity region 13. However, embodiments are not limited thereto, e.g., the lower surface of the first diffusion prevention pattern 23 may be lower than or substantially coplanar with the lower surface of the first impurity region 13.

Figure 6:
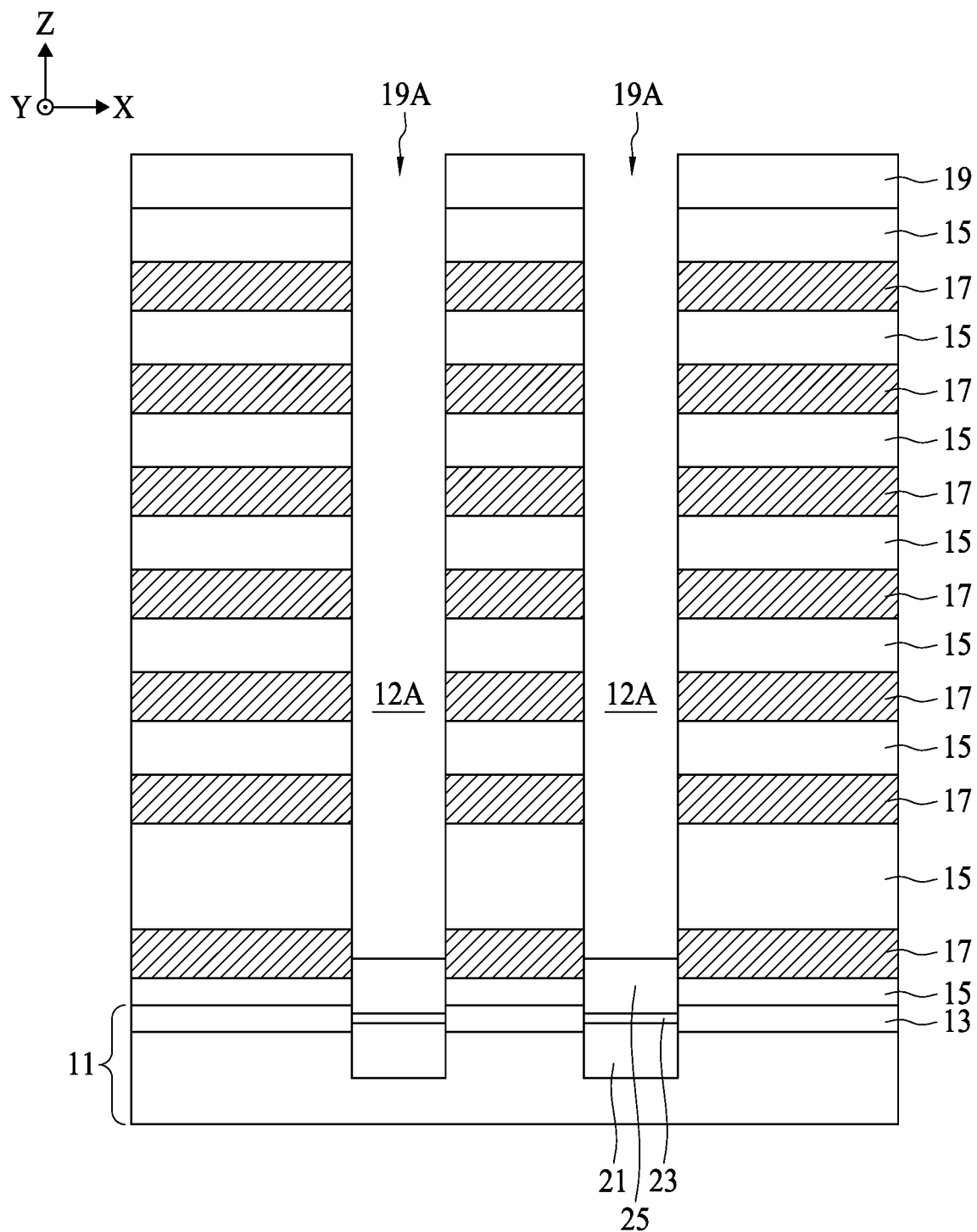

Referring to FIG. 6, a doped semiconductor pattern 25 may be formed on the first diffusion prevention pattern 23 to partially fill the channel hole 12A. In some embodiments, a second SEG process may be performed using the first undoped semiconductor pattern 21, having the first diffusion prevention pattern 23 thereon, as a seed to form the doped semiconductor pattern 25 partially filling the channel hole 12A. Thus, the doped semiconductor pattern 25 may include single crystalline silicon, single crystalline germanium, etc., depending on the material of the first undoped semiconductor pattern 21.

In example embodiments, the second SEG process may be performed using a semiconductor source gas, an impurity source gas, an etching gas, and a carrier gas. In an example embodiment, the semiconductor source gas may include a silicon source gas, e.g., dichlorosilane (SiH.sub.2Cl.sub.2) gas, the impurity source gas may include a p-type impurity source gas, e.g., diborane (B.sub.2H.sub.6) gas, the etching gas may include, e.g., hydrogen chloride (HCl) gas, and the carrier gas may include, e.g., hydrogen (H.sub.2) gas. Thus, the doped semiconductor pattern 25 may include single crystalline silicon doped with p-type impurities, e.g., boron.

When the second SEG process for forming the doped semiconductor pattern 25 is performed, the p-type impurity source gas is used, e.g., to provide impurities within the grown doped semiconductor pattern 25. Thus, the doped semiconductor pattern 25 may have a relatively uniform doping concentration in the first direction, or may have a desired doping profile. That is, when compared to an ion implantation process performed to implant impurities into an already formed undoped semiconductor pattern, the impurity source gas in example embodiments is used during the SEG process that forms the doped semiconductor pattern 25, so the doped semiconductor pattern 25 is grown with impurities, i.e., rather than having impurities implanted therein, to have a uniform doping profile or a desired doping profile.

That is, as a plurality of channel holes 12A is formed in the second and third directions, thicknesses or heights of the undoped semiconductor patterns along the first direction, i.e., along the vertical direction with respect to the top surface of the substrate, may have distributions. Thus, if completely undoped semiconductor patterns were to be formed in the bottoms of the channel holes 12A, and if impurities were to be implanted into the undoped semiconductor patterns by an ion implantation process, the resultant doped semiconductor patterns would have a doping concentration distribution in the first direction according to the thickness distribution of the undoped semiconductor patterns. In other words, due to the ion implantation process implanting ions to a predetermined depth within the undoped semiconductor patterns along the vertical direction, the resultant doped semiconductor patterns may have a varying doping concentration in the first direction.

However, in accordance with example embodiments, as the doped semiconductor patterns 25 are formed by the second SEG process using the impurity source gas, the doped semiconductor patterns 25 are epitaxially grown with impurities. Thus, the doping concentrations of the doped semiconductor patterns 25 may not be influenced by the thickness distribution of the doped semiconductor patterns 25, and may be relatively uniform, e.g., as compared to impurities ion implanted from an upper portion of the already formed undoped semiconductor pattern.

When the doped semiconductor pattern 25 is formed by the second SEG process, the first diffusion prevention pattern 23 is formed under the doped semiconductor pattern 25, i.e., the first diffusion prevention pattern 23 remains between the first undoped semiconductor pattern 21 and the doped semiconductor pattern 25. Thus, the impurities doped into the doped semiconductor pattern 25 may not diffuse into the underlying first undoped semiconductor pattern 21. Accordingly, the doped semiconductor pattern 25 may have a desired doping profile, and the doping concentration distribution of the doped semiconductor patterns 25 may not increase.

In example embodiments, a lower surface of the doped semiconductor pattern 25 may be lower than the upper surface of the substrate 11, and an upper surface of the doped semiconductor pattern 25 may be higher than a lower surface of the lowermost one of the sacrificial layer 17. Thus, the doped semiconductor pattern 25 may overlap the first impurity region 13 at an upper portion of the substrate 11 and the lowermost one of the sacrificial layers 17 in a horizontal direction substantially parallel to the upper surface of the substrate 11.

In example embodiments, the upper surface of the doped semiconductor pattern 25 may be lower than an upper surface of the lowermost one of the sacrificial layers 17. However, embodiments are not limited thereto.

Figure 7:
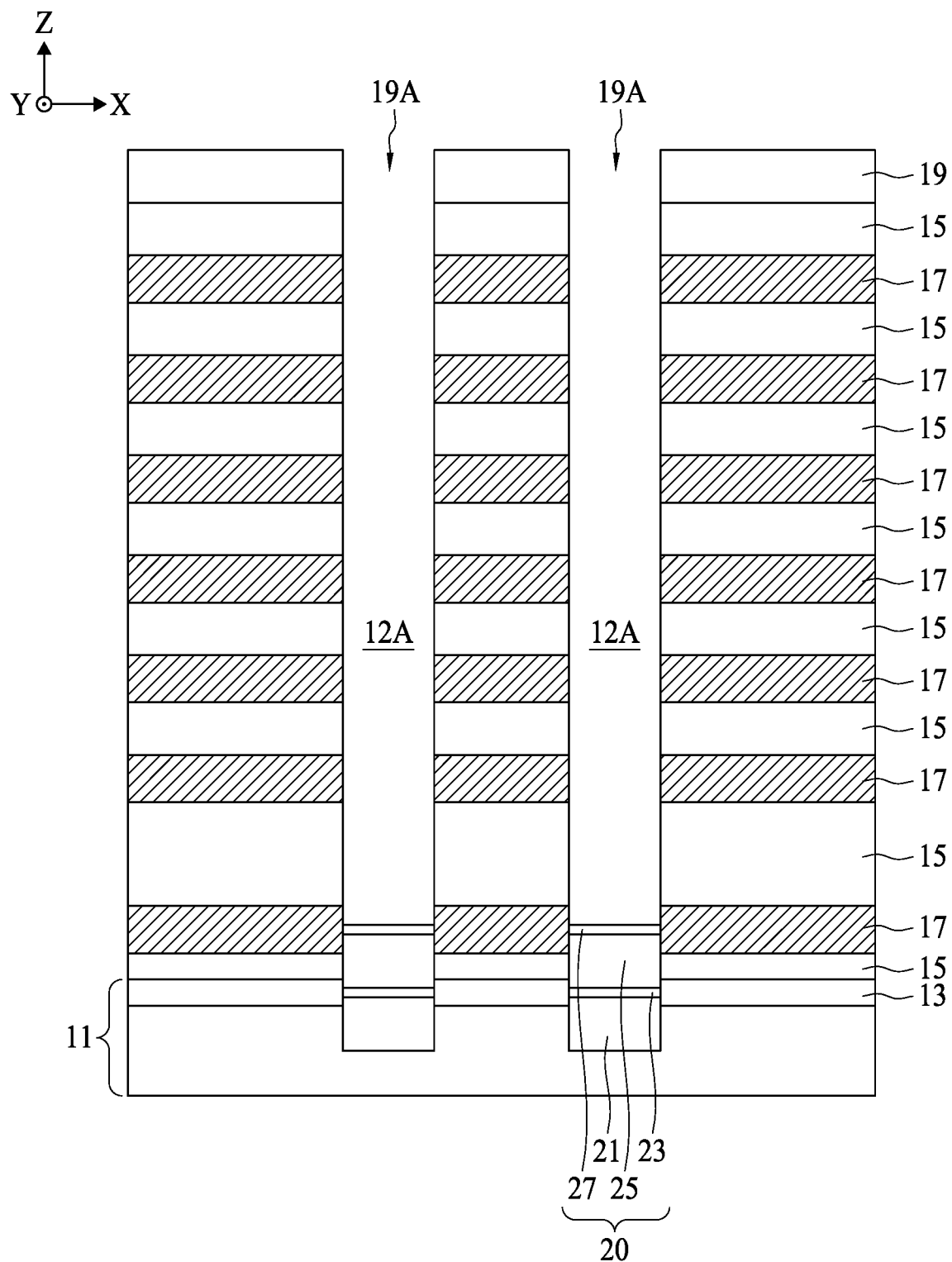

Referring to FIG. 7, a second GPD process may be performed on the doped semiconductor pattern 25 to form the second diffusion prevention pattern 27 on the doped semiconductor pattern 25. In example embodiments, the second GPD process may be performed using a carbon source gas, and thus a semiconductor pattern doped with carbon and boron may be formed as the second diffusion prevention pattern 27. When the doped semiconductor pattern 25 includes single crystalline silicon, the second diffusion prevention pattern 27 may include single crystalline silicon doped with carbon and boron.

Figure 8:
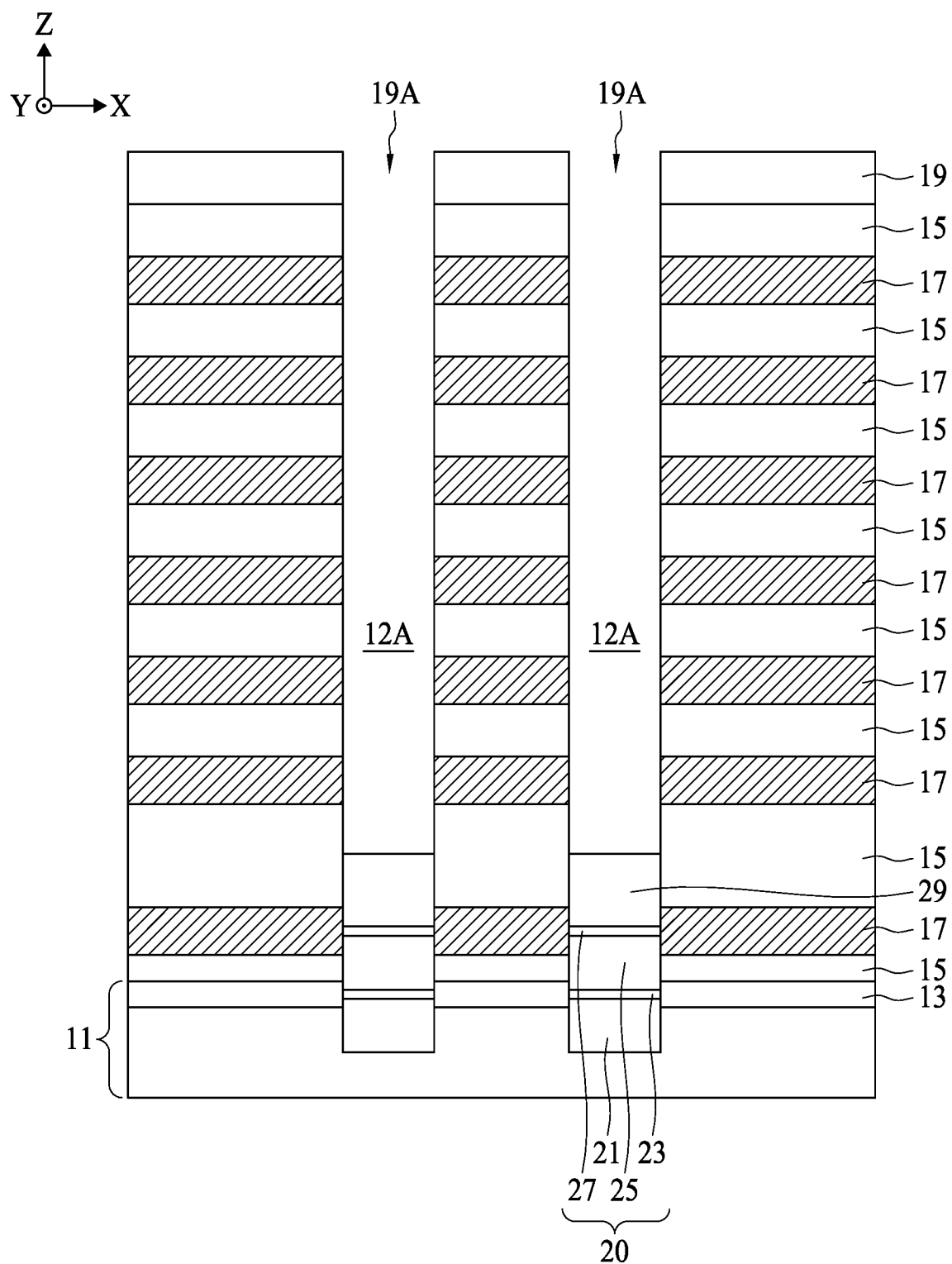

Referring to FIG. 8, a second undoped semiconductor pattern 29 may be formed on the second diffusion prevention pattern 27 to partially fill the channel hole 12A. In some embodiments, a third SEG process may be performed using the doped semiconductor pattern 25 having the second diffusion prevention pattern 27 thereon as a seed to form the second undoped semiconductor pattern 29 partially filling the channel hole 12A. Thus, the second undoped semiconductor pattern 29 may include single crystalline silicon, single crystalline germanium, etc., depending on the material of the doped semiconductor pattern 25.

In example embodiments, the third SEG process may be performed using a semiconductor source gas, an etching gas, and a carrier gas like the first SEG process. Thus, the second undoped semiconductor pattern 29 may include single crystalline silicon not doped with impurities.

In example embodiments, a lower surface of the second undoped semiconductor pattern 29 may be lower than the upper surface of the lowermost one of the sacrificial layers 17. However, embodiments are not limited thereto. An upper surface of the second undoped semiconductor pattern 29 may be located between lower and upper surfaces of one of the insulation layers 15 at a second level from the upper surface of the substrate 11 in the first direction.

When the third SEG process is performed, the first and second diffusion prevention patterns 23 and 27 are formed on the lower and upper surfaces of the doped semiconductor pattern 25, respectively, and thus the impurities doped into the doped semiconductor pattern 25 may not diffuse into the first and second undoped semiconductor patterns 21 and 29. Accordingly, the doped semiconductor pattern 25 may maintain the desired doping profile.

The first undoped semiconductor pattern 21, the first diffusion prevention pattern 23, the doped semiconductor pattern 25, the second diffusion prevention pattern 27, and the second undoped semiconductor pattern 29 sequentially stacked on the substrate 11 may form the lower semiconductor pattern structure. The first and second undoped semiconductor patterns 21 and 29 at lower and upper portions of the lower semiconductor pattern structure may not be doped with impurities.

Thus, when compared to a semiconductor pattern formed by a single SEG process with impurities implanted by ion implantation from an upper portion of the semiconductor pattern, only a small portion of the lower semiconductor pattern structure in the example embodiments are doped with impurities in the first direction. Accordingly, the doping profile distribution among the lower semiconductor pattern structures in the respective channel holes 12A may decrease. The doped semiconductor pattern 25 may not be doped by an independent ion implantation process but may be doped during the second SEG process, and thus the doping profile in the plurality of doped semiconductor patterns 25 may not be influenced by the thickness distribution of the doped semiconductor patterns 25 to be relatively uniform.

The lower semiconductor pattern structure may serve as a channel, e.g., like an upper channel structure 41 subsequently formed. Thus, the lower semiconductor pattern structure and the upper channel structure 41 may be referred to as the lower channel structure and the upper channel structure, respectively.

Figure 9:
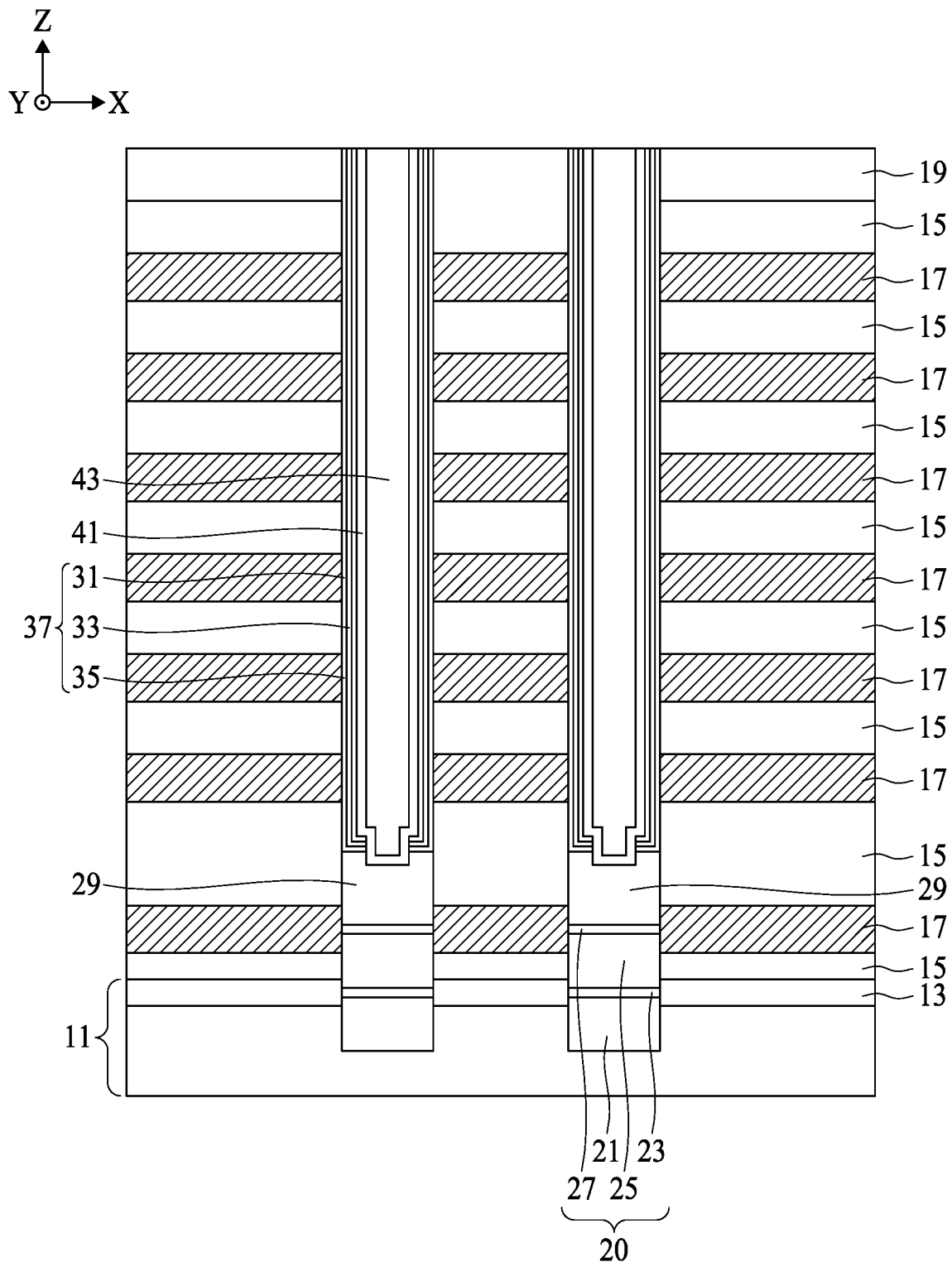
FIG. 9 is a cross-sectional view illustrating an intermediate stage in the formation of a charge storage structure and an upper channel structure are formed in the channel hole and over the lower channel structure, in accordance with some embodiments of the present disclosure.

Referring to FIG. 9, at the step S17 in the method 10 shown in FIG. 2, a charge storage structure and an upper channel structure are formed in the channel hole and over the lower channel structure. In some embodiments, a first blocking layer, a charge storage layer, a tunnel insulation layer, and a first spacer layer may be sequentially formed on sidewalls of the channel holes 12A, upper surfaces of the lower semiconductor pattern structures, and an upper surface of the hard mask 19. The first spacer layer may be anisotropically etched to form a first spacer on the sidewalls of the channel holes 12A, and the tunnel insulation layer, the charge storage layer, and the first blocking layer may be etched using the first spacer as an etching mask to form the tunnel insulation pattern 35, the charge storage pattern 33, and the first blocking pattern 31, respectively, on the upper surface of the lower semiconductor pattern structure and the sidewall of the channel hole 12A, which may have a cup-like shape of which a bottom is opened. During the etching process, an upper portion of the lower semiconductor pattern structure, i.e., the second undoped semiconductor pattern 29, may be also partially removed. The tunnel insulation pattern 35, the charge storage pattern 33, and the first blocking pattern 31 may form a charge storage structure 37. The first blocking layer may be formed of an oxide, e.g., silicon oxide, the charge storage layer may be formed of a nitride, e.g., silicon nitride, the tunnel insulation layer may be formed of an oxide, e.g., silicon oxide, and the first spacer layer may be formed of a nitride, e.g., silicon nitride.

After removing the first spacer, an upper semiconductor layer may be formed on the exposed second undoped semiconductor pattern 29, the tunnel insulation pattern 35, and the hard mask 19. A filling layer may be formed on the upper semiconductor layer to sufficiently fill remaining portions of the channel holes 12A. The upper semiconductor layer may be formed of doped or undoped polysilicon or amorphous silicon. The filling layer may be formed of an oxide, e.g., silicon oxide.

The filling layer and the upper semiconductor layer may be planarized until an upper surface of the hard mask 19 may be exposed to form a filling pattern 43 filling the remaining portion of each of the channel holes 12A, and the upper semiconductor layer may be transformed into an upper channel structure 41. Thus, the charge storage structure 37, the upper channel structure 41, and the filling pattern 43 may be sequentially stacked on the lower semiconductor pattern structure in each of the channel holes 12A. The charge storage structure 37 may have a cup-like shape of which a bottom is opened, the upper channel structure 41 may have a cup-like shape, and the filling pattern 43 may have a pillar shape.

As described above, each of the lower semiconductor pattern structure and the upper channel structure 41 may serve as a channel, and the lower semiconductor pattern structure and the upper channel structure 41 may form a channel structure. As the channel holes 12A may form the channel hole column, the channel hole block, and the channel hole array, the channel structure may also form a channel structure column, a channel structure block, and a channel structure array.

Figure 10:
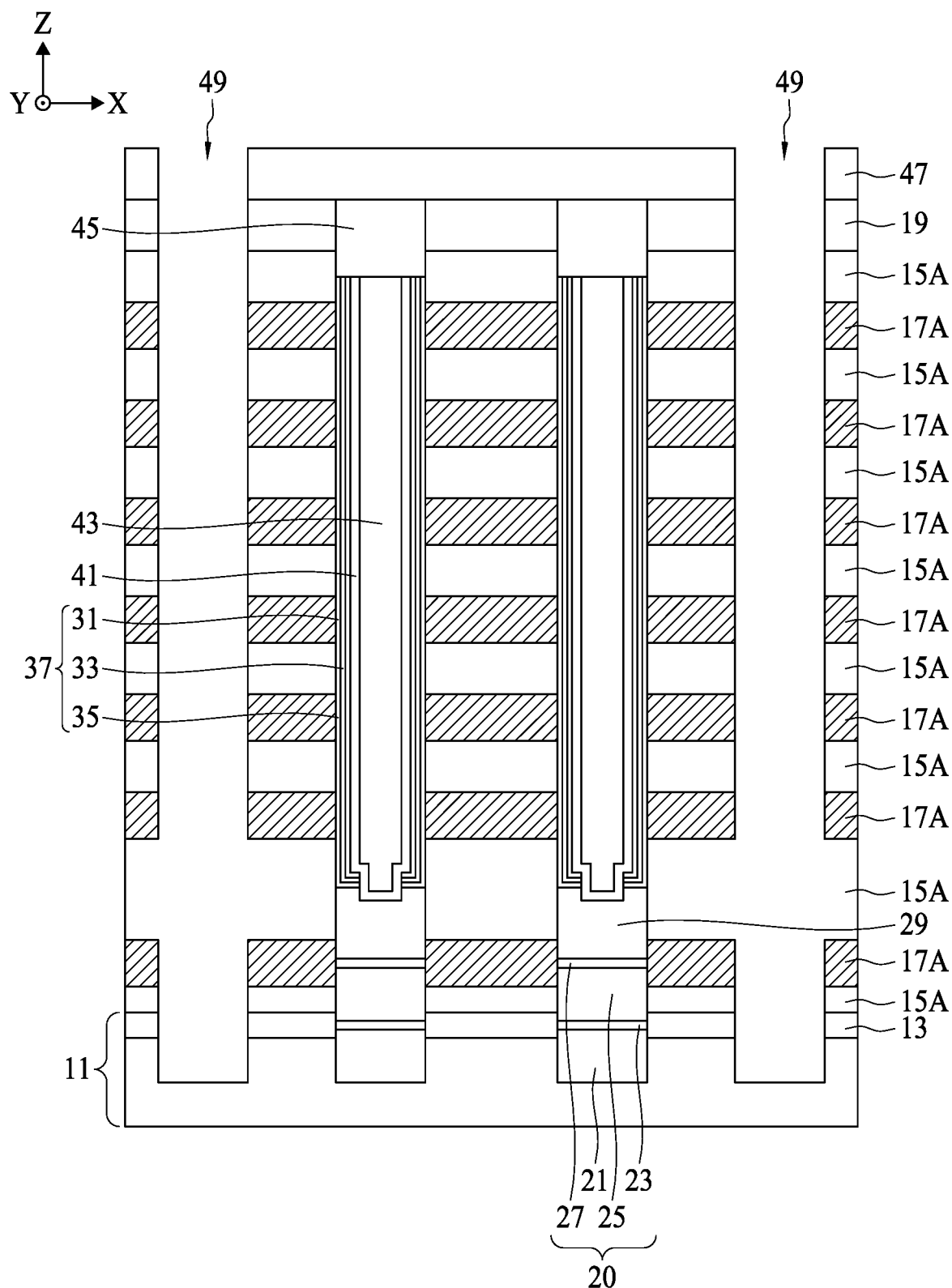
FIG. 10 is a cross-sectional view illustrating an intermediate stage in the formation of an opening penetrating the stack structure and into the substrate, in accordance with some embodiments of the present disclosure.

Referring to FIG. 10, at the step S19 in the method 10 shown in FIG. 2, fabrication processes are performed to form an opening penetrating the stack structure 12. In some embodiments, an upper portion of the first structure including the filling pattern 43, the channel structure, and the charge storage structure 37 may be removed to form a trench. The capping pattern 45 may be formed to fill the trench. In some embodiments, after removing the upper portion of the first structure by an etch back process to form the trench, a capping layer filling the trench may be formed on the first structure and the hard mask 19, and an upper portion of the capping layer may be planarized until the upper surface of the hard mask 19 may be exposed to form the capping pattern 45. In example embodiments, the capping layer may be formed of doped or undoped polysilicon or amorphous silicon. When the capping layer is formed to include amorphous silicon, a crystallization process may be further performed thereon.

The third insulating interlayer 47 may be formed on the hard mask 19 and the capping pattern 45, a second mask may be formed on the third insulating interlayer 47, and an opening 49 may be formed through the second and third insulating interlayers 140 and 47, the insulation layers 15, and the sacrificial layers 17 to expose an upper surface of the substrate 11. Accordingly, as the opening 49 extends in the second direction, each of the insulation layers 15 may be transformed into a plurality of insulation patterns 15A spaced apart from each other in the third direction, and each of the insulation patterns 15A may extend in the second direction. Additionally, each of the sacrificial layers 17 may be transformed into a plurality of sacrificial patterns 17A spaced apart from each other in the third direction, and each of the sacrificial patterns 17A may extend in the second direction. The third insulating interlayer 47 may be formed of an oxide, e.g., silicon oxide. In example embodiments, the opening 49 may extend in the second direction between the channel structure blocks, and a plurality of openings 49 may be formed in the third direction.

Figure 11:
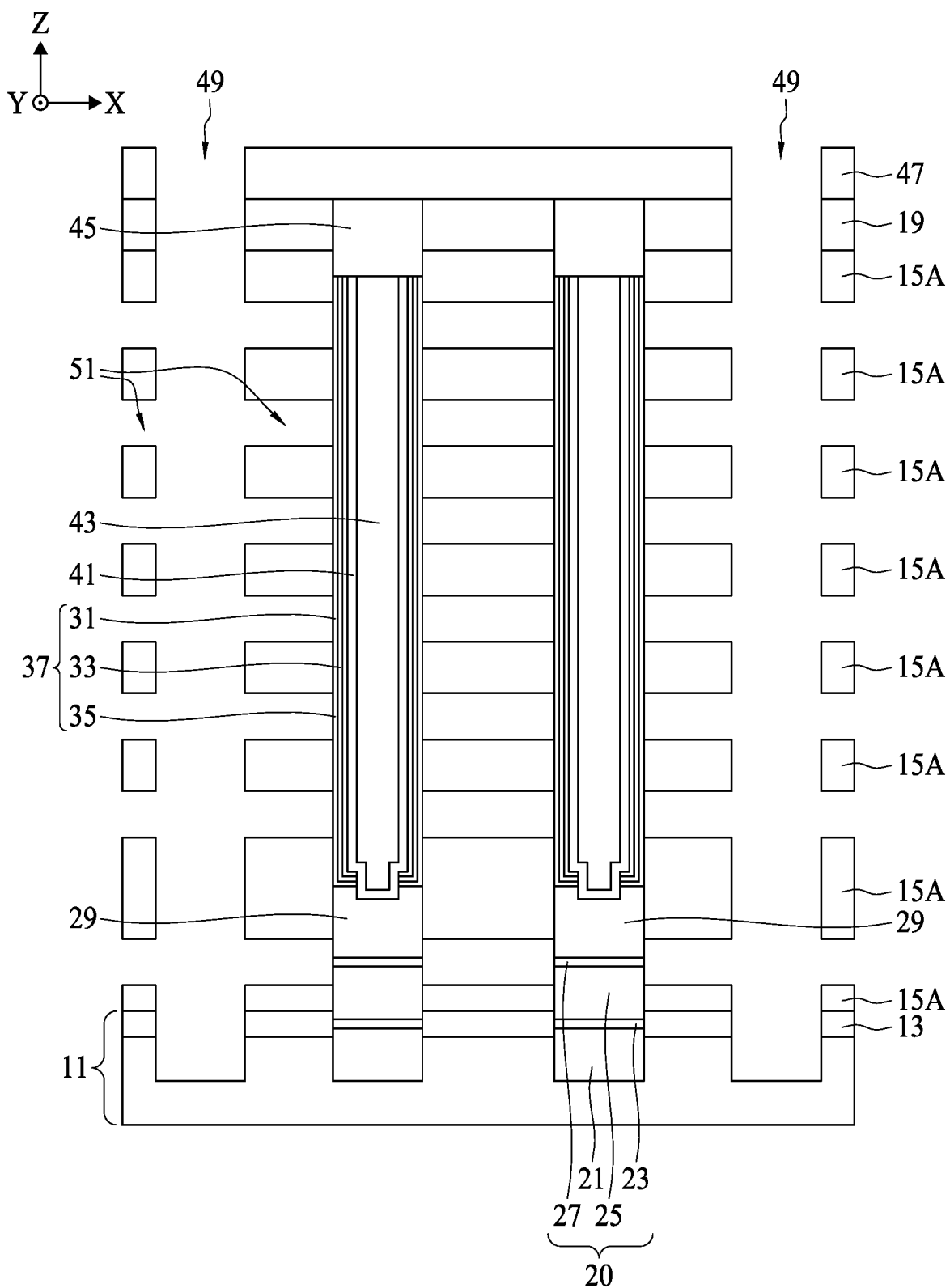
FIGS. 11-14 are cross-sectional views illustrating an intermediate stage in the removing of the sacrificial patterns (layer) and the formation of gate electrodes through the opening, in accordance with some embodiments of the present disclosure.

Referring to FIG. 11, at the step S21 in the method 10 shown in FIG. 2, the sacrificial patterns (layer) 17A are removed, and gate electrodes are formed through the opening. In some embodiments, after removing the second mask, the sacrificial patterns 17A exposed by the opening 49 may be removed to form a gap 51 between the insulation patterns 15A at respective levels, and a portion of an outer sidewall of the first blocking pattern 31 and a portion of a sidewall of the lower semiconductor pattern structure may be exposed by the gap 51. At least a portion of a sidewall of the doped semiconductor pattern 25 of the lower semiconductor pattern structure may be exposed by the gap 51. In example embodiments, the sacrificial patterns 17A exposed by the gap 51 may be removed by a wet etching process using an etchant including, e.g., phosphoric acid or sulfuric acid.

Figure 12:
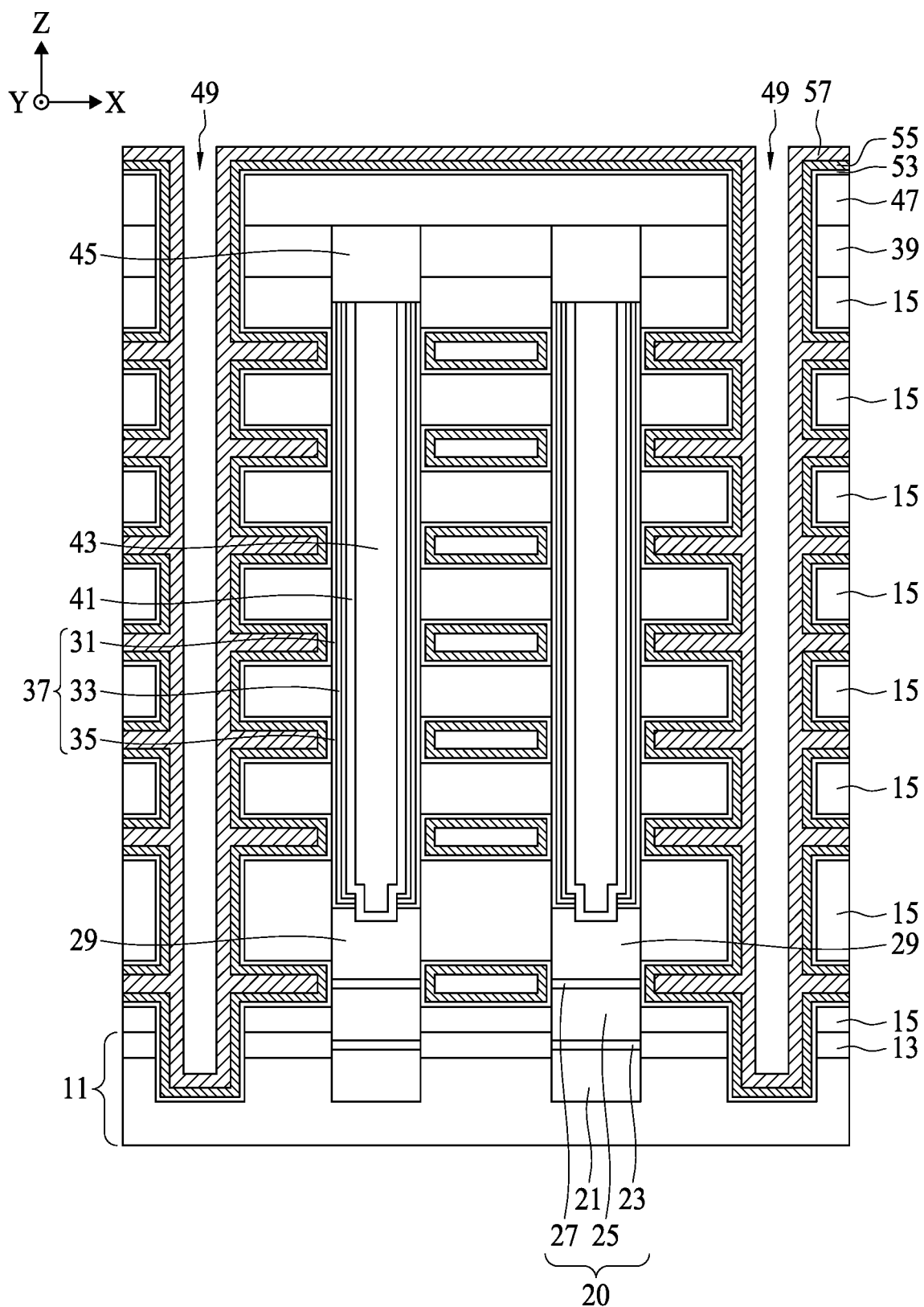

Referring to FIG. 12, a second blocking layer 53 is formed on the exposed portion of the outer sidewall of the first blocking pattern 31, the exposed portion of the sidewall of the lower semiconductor pattern structure, an inner wall of the gap 51, surfaces of the insulation patterns 15A, the exposed upper surface of the substrate 11, and an upper surface of the third insulating interlayer 47; subsequently, a gate barrier layer 55 may be formed on the second blocking layer 53. Then, a gate conductive layer 57 may be formed on the gate barrier layer 55 to sufficiently fill a remaining portion of the gap 51.

The second blocking layer 53 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer 57 may be formed of a metal having a low resistance, e.g., tungsten, titanium, tantalum, platinum, etc., and the gate barrier layer 55 may be formed of a metal nitride, e.g., titanium nitride, tantalum nitride, etc. Alternatively, the gate barrier layer 55 may be formed to have a first layer including a metal and a second layer including a metal nitride layer sequentially stacked.

Figure 13:
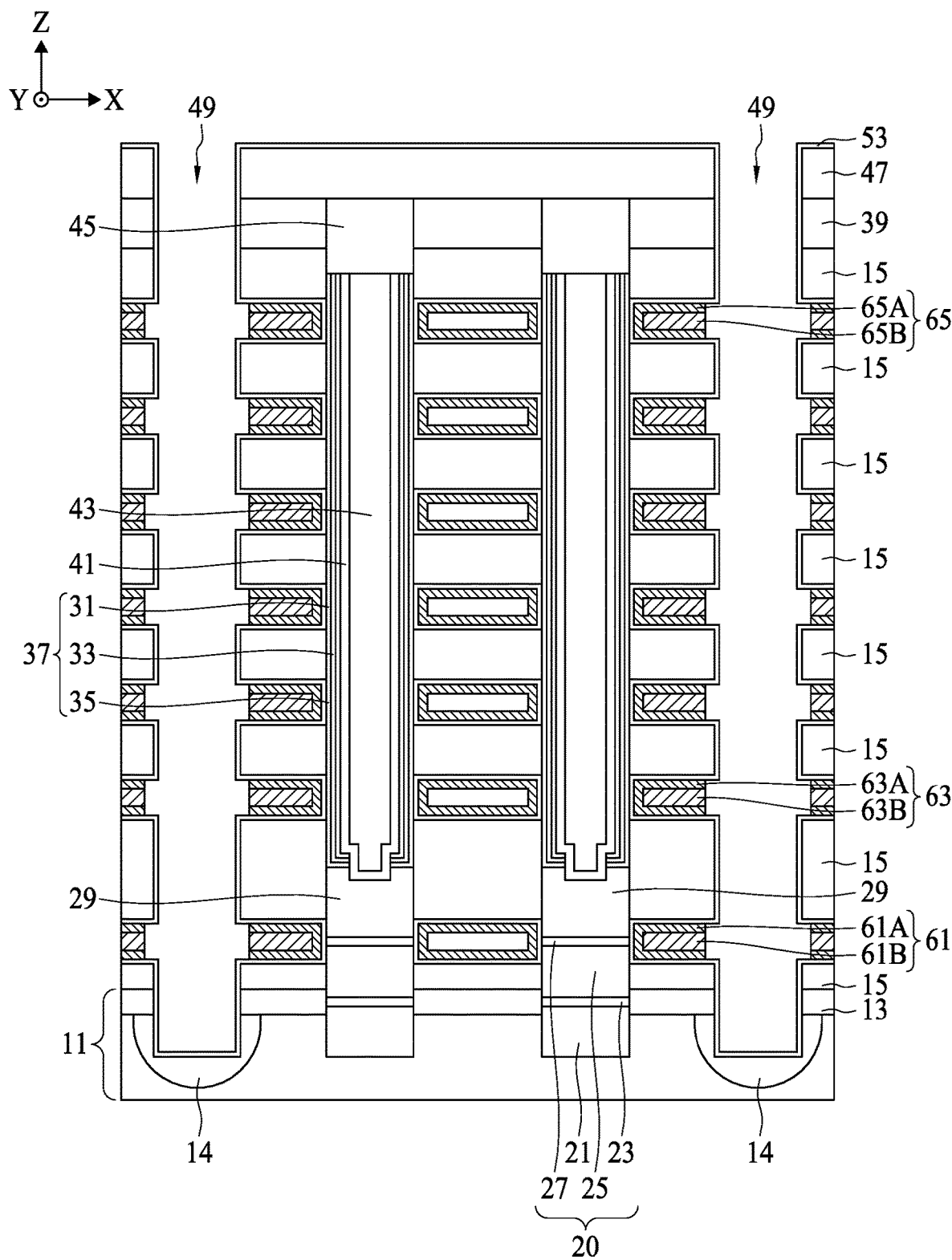

Referring to FIG. 13, the gate conductive layer 57 and the gate barrier layer 55 may be partially removed to form a gate conductive pattern and a gate barrier pattern, respectively, in the gap 51, which may form a gate electrode. In example embodiments, the gate conductive layer 57 and the gate barrier layer 55 may be partially removed by a wet etching process. In example embodiments, the gate electrode may be formed to extend in the second direction, and a plurality of gate electrodes may be formed in the third direction. That is, a plurality of gate electrodes each extending in the second direction may be spaced apart from each other in the third direction by the opening 49.

The gate electrode may include first, second, and third gate electrodes 61, 63, and 65 sequentially stacked in the first direction. The first gate electrode 61 may serve as a ground selection line (GSL), the second gate electrode 63 may serve as a word line, and the third gate electrode 65 may serve as a string selection lien (SSL). Each of the first to third gate electrodes 61, 63 and 65 may be formed at a single level or a plurality of levels.

In example embodiments, the first gate electrode 61 may be formed at a lowermost level, the third gate electrode 65 may be formed at an uppermost level and a level under the uppermost level, and the second gate electrode 63 may be formed at even levels between the first and third gate electrodes 61 and 65. Thus, the first gate electrode 61 may be formed adjacent the lower semiconductor pattern structure, more particularly, the doped semiconductor pattern 25, and each of the second and third gate electrodes 63 and 65 may be formed adjacent the upper channel structure 41.

The first gate electrode 61 may include the first gate conductive pattern 61B and the first gate barrier pattern 61A covering lower and upper surfaces and a portion of a sidewall of the first gate conductive pattern 61B. The second gate electrode 63 may include the second gate conductive pattern 63B and the second gate barrier pattern 63A covering lower and upper surfaces and a portion of a sidewall of the second gate conductive pattern 63B. The third gate electrode 65 may include the third gate conductive pattern 65B and the third gate barrier pattern 65A covering lower and upper surfaces and a portion of a sidewall of the third gate conductive pattern 65B.

Referring to FIG. 13, impurities may be implanted into an upper portion of the substrate 11 exposed by the opening 49 to form the second impurity region 14. In example embodiments, the impurities may include n-type impurities, e.g., phosphorus, arsenic, etc.

Figure 14:
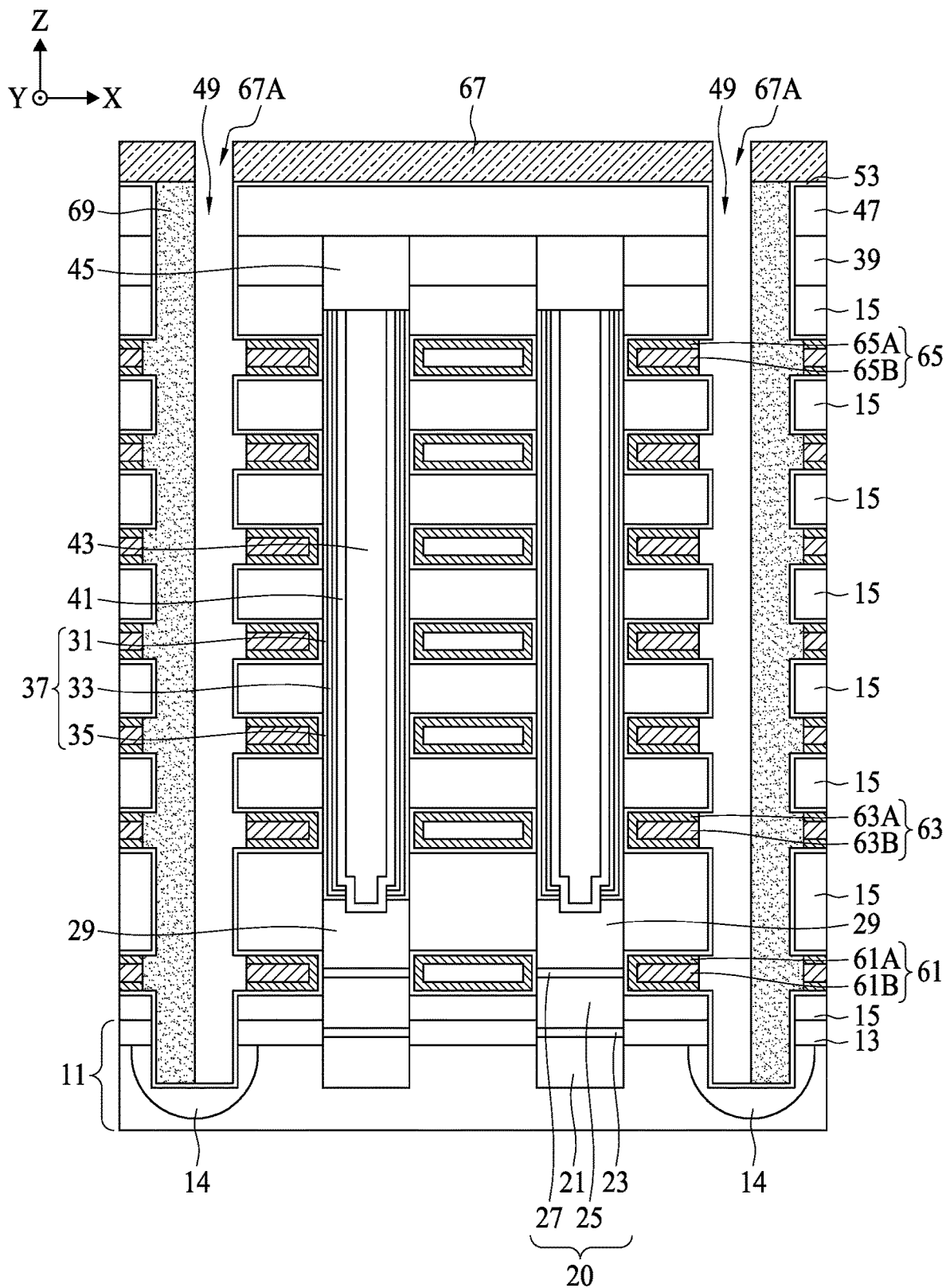

Referring to FIG. 14, a coverage layer 69 is formed to fill the opening 49, and a portion of the coverage layer 69 is removed through an opening 67A of a hard mask 67, such that portions of the first, second, and third gate electrodes 61, 63, and 65 are selectively covered by the coverage layer 69, while the other portions of the first, second, and third gate electrodes 61, 63, and 65 are exposed by the opening 49.

Figure 15:
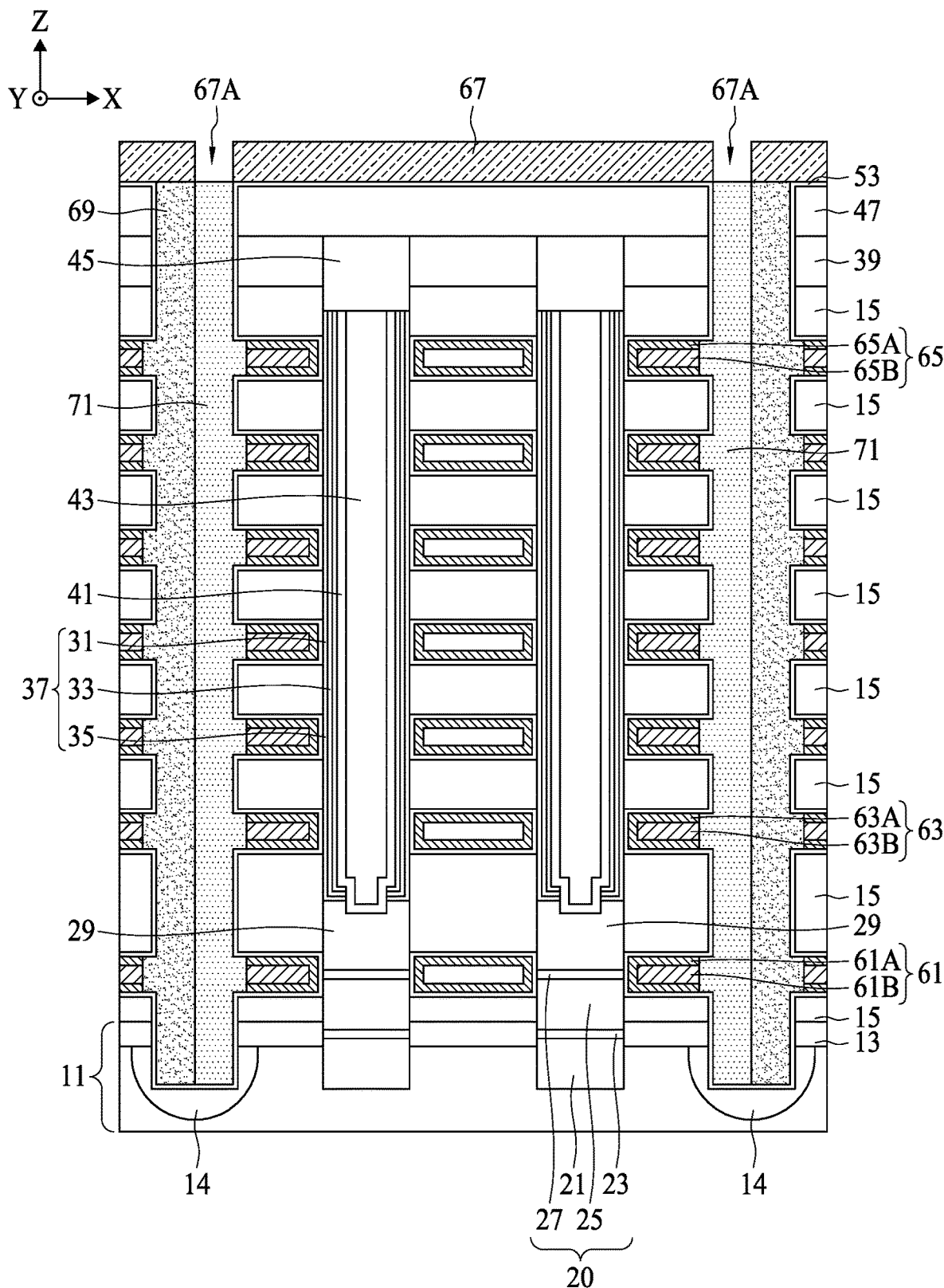
FIGS. 15-18 are cross-sectional views illustrating an intermediate stage in the formation of an energy removable blocks adjacent to the gate electrodes, and in the filling of the opening with a source line and a dielectric material, in accordance with some embodiments of the present disclosure.

Referring to FIG. 15, at the step S23 in the method 10 shown in FIG. 2, fabrication processes are performed to form an energy removable blocks adjacent to the gate electrodes, and the opening is then filled with a source line and a dielectric material. In some embodiments, an energy removable layer 71 is formed to fill the opening 49. In some embodiments, the materials of the energy removable layer include a thermal decomposable material. In some other embodiments, the materials of the energy removable layer include a photonic decomposable material, an e-beam decomposable material, or another applicable energy decomposable material. Specifically, in some embodiments, the materials of the energy removable layer include a base material and a decomposable porogen material that is substantially removed once being exposed to an energy source (e.g., heat).

In some embodiments, the base material includes hydrogen silsesquioxane (HSQ), methylsilsesquioxane (MSQ), porous polyarylether (PAE), porous SiLK, or porous silicon oxide (SiO2), and the decomposable porogen material includes a porogen organic compound, which can provide porosity to the space originally occupied by the energy removable layer in the subsequent processes.

Figure 16:
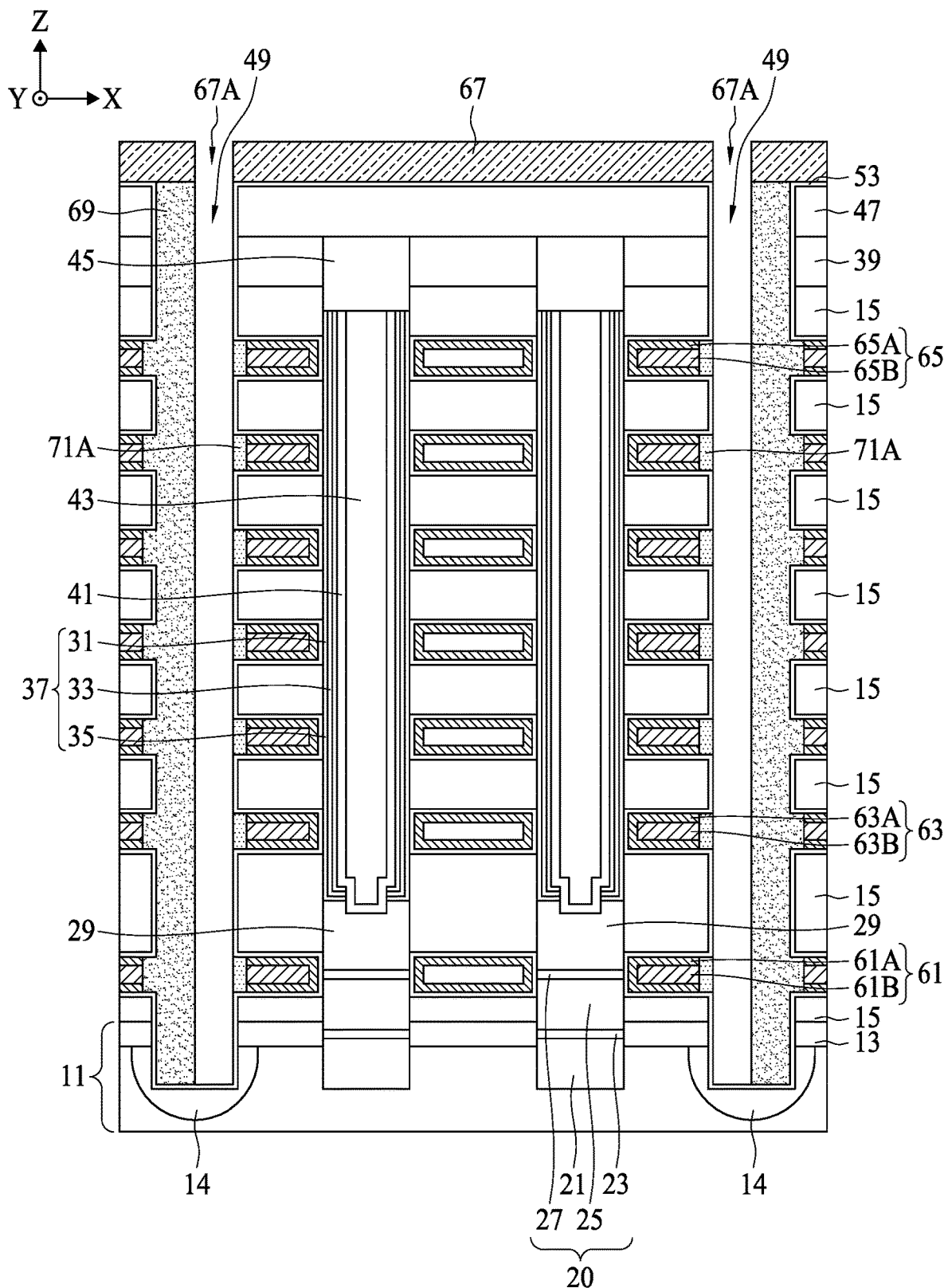

Referring to FIG. 16, an anisotropic etching process is performed through an opening 67A of the hard mask 67, such that a portion of the energy removable layer 71 right under the opening 67A is selectively removed, while leaving a plurality of energy removable blocks adjacent to the first, second, and third gate electrodes 61, 63, and 65.

Figure 17:
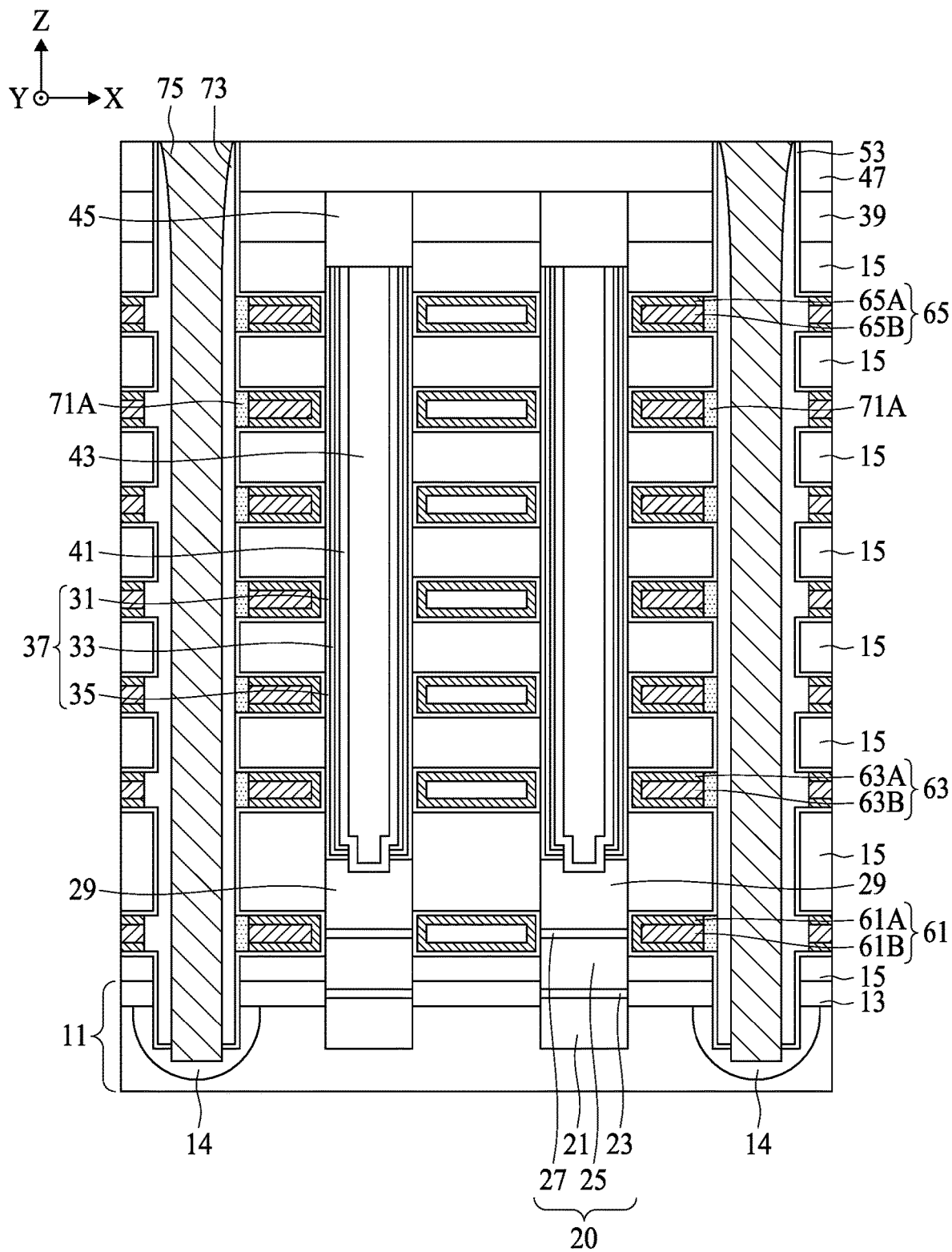

Referring to FIG. 17, the hard mask 67 and the coverage layer 69 are removed to reform the opening 49, and a second spacer layer may be formed on the exposed upper surface of the opening 49, an upper surface of the second impurity region 14, a sidewall of the opening 49, and an upper surface of the third insulating interlayer 47. Subsequently, the second spacer layer may be anisotropically etched to form the second spacer 73 on the sidewall of the opening 49. Thus, a portion of the second impurity region 14 at an upper portion of the substrate 11 may be exposed. The second spacer layer may be formed of an oxide, e.g., silicon oxide.

Subsequently, a common source/drain line (CSL) 75 may be formed on the exposed second impurity region 14 to fill a remaining portion of the opening 49. In example embodiments, a conductive layer may be formed on the exposed upper surface of the second impurity region 14, the second spacer 73, and the third insulating interlayer 47 to sufficiently fill a remaining portion of the opening 49, and may be planarized until an upper surface of the third insulating interlayer 47 may be exposed to form the CSL 75. A portion of the second blocking layer 53 on the third insulating interlayer 47 may be also removed. The conductive layer may be formed of, e.g., a metal, a metal nitride and/or a metal silicide.

Figure 18:
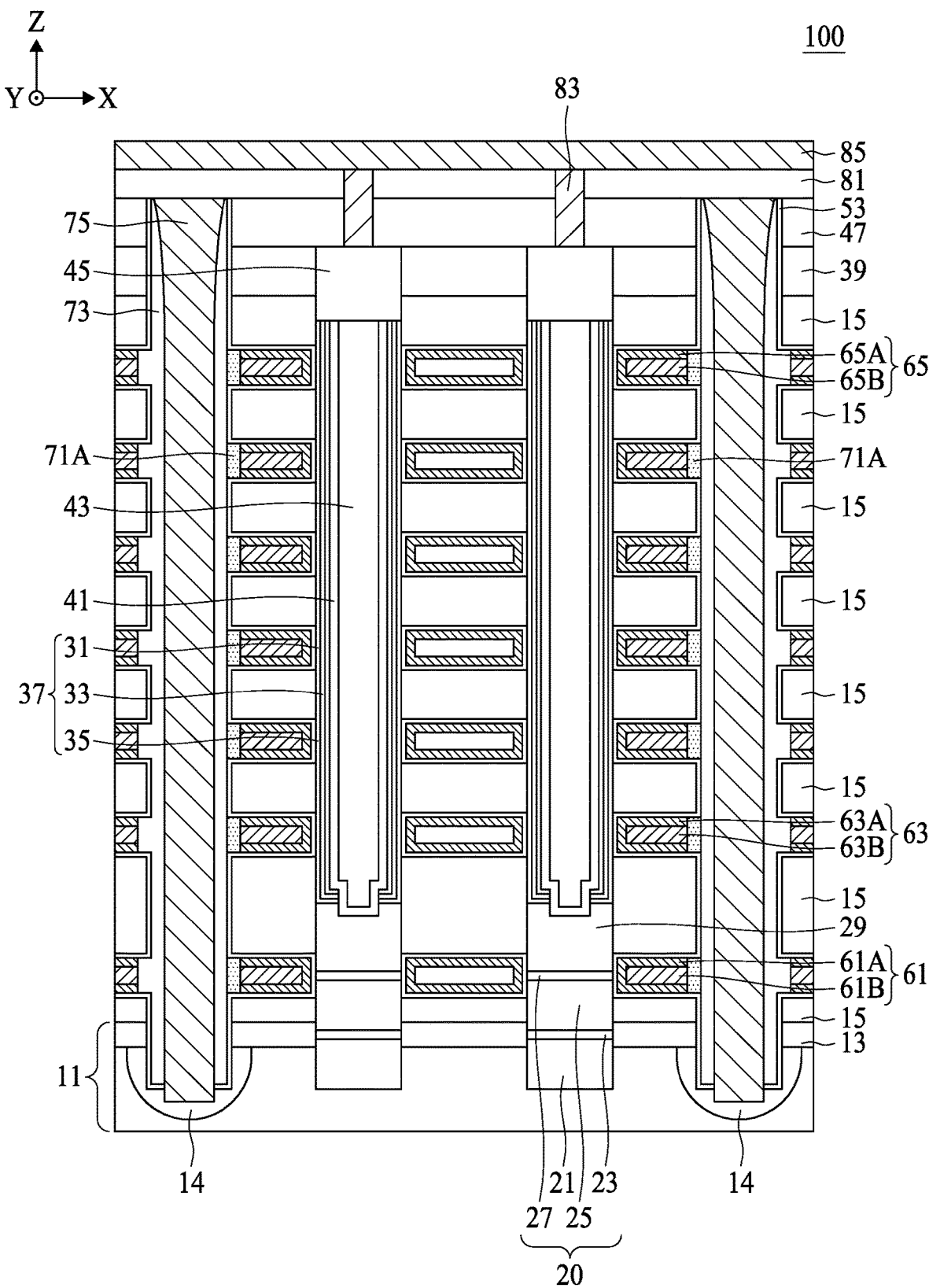

Referring to FIG. 18, a fourth insulating interlayer 81 may be formed on the third insulating interlayer 47, the CSL 75, the second spacer 73 and the second blocking layer 53. Next, the contact plug 83 may be formed through the third and fourth insulating interlayers 47 and 81 to contact the capping pattern 45.

The fourth insulating interlayer 81 may be formed of an oxide, e.g., silicon oxide, and thus may be merged with the underlying third insulating interlayer 47. The contact plug 83 may be formed of a metal, e.g., tungsten, tantalum, titanium, etc., or a metal nitride, e.g., titanium nitride, tantalum nitride, tungsten nitride, etc.

A fifth insulating interlayer may be formed on the fourth insulating interlayer 81 and the contact plug 83, and a bit line 85 may be formed through the fifth insulating interlayer. In example embodiments, the bit line 85 may be formed by a damascene process, and may be formed of a metal, e.g., tungsten, tantalum, titanium, etc., or a metal nitride, e.g., titanium nitride, tantalum nitride, tungsten nitride, etc. The bit line 85 may contact an upper surface of the contact plug 83. In example embodiments, the bit line 85 may extend in the third direction, and a plurality of bit lines 85 may be formed in the second direction.

Figure 19:
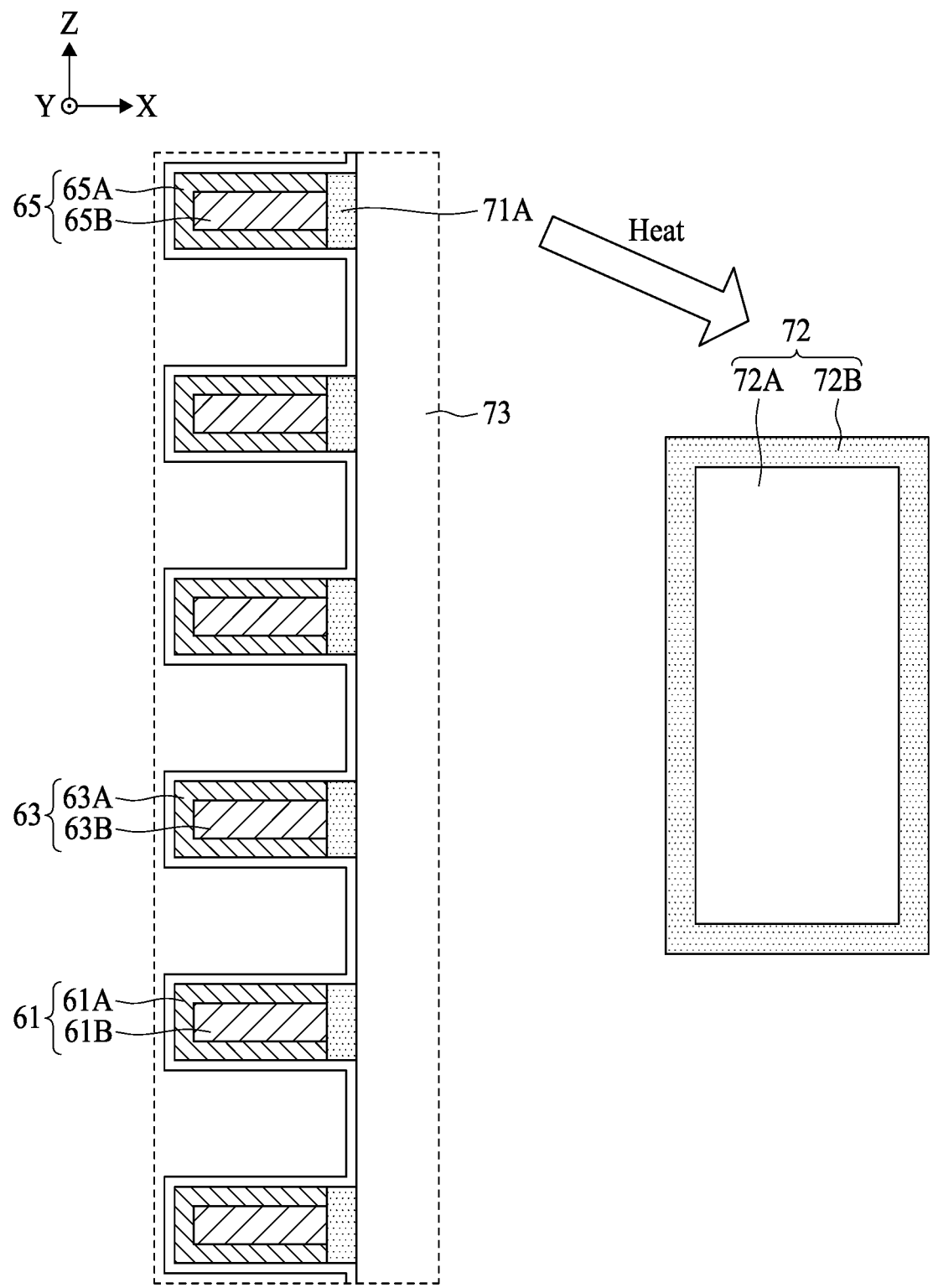
FIG. 19 is a cross-sectional view illustrating an intermediate stage in the operation of performing a heat treatment process to transform the energy removable block an air gap structure including an air gap enclosed by a liner layer, in accordance with some embodiments of the present disclosure.

Referring to FIG. 19, at the step the step S25 in the method 10 shown in FIG. 2, a heat treatment process is performed in accordance with some embodiments. In some embodiments, during the heat treatment process, the energy removable block 71A is transformed into an air gap structure 72 including an air gap 72A enclosed by a liner layer 72B.

In some other embodiments, the heat treatment process can be replaced by a light treatment process, an e-beam treatment process, a combination thereof, or another applicable energy treatment process. For example, an ultra-violet (UV) light or laser light may be used to remove the decomposable porogen materials of the energy removable blocks 17A, to obtain the air gap structure 72 including the air gap 72A enclosed by the liner layer 72B.

By the above processes, the vertical memory structure 100 with air gap structure 72 may be manufactured. As described above, the lower channel structure 20 of the example embodiments is not formed by performing a single SEG process followed by an ion implantation process. Therefore, the thickness distribution or height distribution that may be generated in lower semiconductor pattern structures due to ion implantation, e.g., causing different doping profiles of impurities in different lower semiconductor pattern structure, may be prevented or substantially minimized.

In accordance with example embodiments, the lower channel structure 20 may be formed by a plurality of SEG processes, and impurities may be doped only in some of the SEG processes. Thus, when compared to impurities doped into whole portions of the lower channel structure 20 via ion implantation, the impurity doping profile distributions among the lower channel structure 20 may decrease since the impurities are doped into only a portion of the lower channel structure 20, e.g., only into the doped semiconductor pattern 25. Additionally, impurities may not be implanted into the doped semiconductor pattern 25 by an ion implantation process, but via an impurity source gas used in the SEG process, thereby providing a desired impurity doping profile. The first and second diffusion prevention patterns 23 and 27 may be formed under and on the doped semiconductor pattern 25, respectively, and thus the impurities doped into the doped semiconductor pattern 25 may not diffuse into the first and second undoped semiconductor patterns 21 and 29 by the SEG process or a heat treatment process. Accordingly, the desired impurity doping profile in the doped semiconductor pattern 25 may be maintained.

Furthermore, the vertical memory structure 100 includes a plurality of conductive features (e.g., the gate electrodes and common source/drain line) disposed over the substrate 11 and the air gap structure 72 and the dielectric second spacer 73 electrically separates conductive features. Therefore, the parasitic capacitance between the conductive features may be reduced. Particularly, the gate electrodes 61, 63, 65 are separated from the common source/drain line 75 by the air gap structure 72 including the air gap 72A enclosed by the liner layer 72B. As a result, the overall device performance may be improved (i.e., the decreased power consumption and resistive-capacitive (RC) delay), and the yield rate of the semiconductor device may be increased.

One aspect of the present disclosure provides a vertical memory structure, comprising: a semiconductor stack including a lower semiconductor pattern structure filling a recess on a substrate and protruding from an upper surface of the substrate in a first direction substantially perpendicular to the upper surface of the substrate; a plurality of gate electrodes surrounding a sidewall of the semiconductor stack, the plurality of gate electrodes being at a plurality of levels, respectively, so as to be spaced apart from each other in the first direction; and a plurality of air gap structures disposed at outer sides of the plurality of gate electrodes respectively.

Another aspect of the present disclosure provides a method for preparing a vertical memory structure, comprising: forming a semiconductor stack including a lower semiconductor pattern structure filling a recess on a substrate and protruding from an upper surface of the substrate in a first direction substantially perpendicular to the upper surface of the substrate; forming a plurality of gate electrodes surrounding a sidewall of the semiconductor stack, the plurality of gate electrodes being at a plurality of levels, respectively, so as to be spaced apart from each other in the first direction; and forming a plurality of air gap structures at outer sides of the plurality of gate electrodes respectively.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for preparing a vertical memory structure, comprising:
    providing a substrate;
    forming an impurity layer at an upper portion of the substrate;
    forming a semiconductor stack including a lower semiconductor pattern structure filling a recess on the substrate and protruding from an upper surface of the substrate in a first direction substantially perpendicular to the upper surface of the substrate;
    forming a plurality of gate electrodes surrounding a sidewall of the semiconductor stack, the plurality of gate electrodes being at a plurality of levels, respectively, so as to be spaced apart from each other in the first direction;
    forming a plurality of air gap structures disposed at outer sides of the plurality of gate electrodes respectively, wherein the plurality of air gap structures comprise a liner layer enclosing an air gap;
    forming a conductive line, and the plurality of air gap structures separate the conductive line from the plurality of gate electrodes, wherein the lower semiconductor pattern structure comprises a first undoped semiconductor pattern, a doped semiconductor pattern, and a second undoped semiconductor pattern sequentially stacked in the first direction;
    forming an upper semiconductor pattern extends in the first direction on the lower semiconductor pattern structure, wherein a lower surface of the doped semiconductor pattern is lower than the upper surface of the substrate, wherein an upper surface of the doped semiconductor pattern of the lower semiconductor pattern is higher than a lower surface of a lowermost one of the plurality of gate electrodes and lower than an upper surface thereof; and
    forming a first diffusion prevention pattern between the first undoped semiconductor pattern and the doped semiconductor pattern; and forming a second diffusion prevention pattern between the doped semiconductor pattern and the second undoped semiconductor pattern.

2. The method for preparing a vertical memory structure of claim 1, wherein each of the first and second diffusion prevention patterns is a semiconductor pattern doped with carbon.

3. The method for preparing a vertical memory structure of claim 2, wherein the second diffusion prevention pattern is a semiconductor pattern doped with carbon and boron.

4. The method for preparing a vertical memory structure of claim 3, wherein the doped semiconductor pattern contacts the impurity layer.

5. The method for preparing a vertical memory structure of claim 3, wherein a lower surface of the doped semiconductor pattern is higher than a lower surface of the impurity layer.

6. The method for preparing a vertical memory structure of claim 3, wherein a lower surface of the doped semiconductor pattern is lower than a lower surface of the impurity layer.

7. The method for preparing a vertical memory structure of claim 3, wherein the impurity layer includes p-type impurities.

* * * * *